United States Patent
Shim et al.

(10) Patent No.: US 12,514,006 B2
(45) Date of Patent: Dec. 30, 2025

(54) IMAGE SENSORS

(71) Applicant: SAMSUNG ELECTRONICS CO., LTD., Suwon-si (KR)

(72) Inventors: Eunsub Shim, Suwon-si (KR); Younggu Jin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 408 days.

(21) Appl. No.: 18/106,764

(22) Filed: Feb. 7, 2023

(65) Prior Publication Data

US 2023/0253438 A1  Aug. 10, 2023

(30) Foreign Application Priority Data

Feb. 7, 2022  (KR) .................. 10-2022-0015765
Mar. 17, 2022 (KR) .................. 10-2022-0033437
Apr. 28, 2022 (KR) .................. 10-2022-0052884

(51) Int. Cl.
*H10F 39/18* (2025.01)
*H10F 39/00* (2025.01)
*H10F 39/12* (2025.01)

(52) U.S. Cl.
CPC ......... *H10F 39/18* (2025.01); *H10F 39/8027* (2025.01); *H10F 39/80373* (2025.01);
(Continued)

(58) Field of Classification Search
CPC ........... H10F 39/8027; H10F 39/80373; H10F 39/80377; H10F 39/812; H10F 39/8023;
(Continued)

(56) References Cited

U.S. PATENT DOCUMENTS 7,285,764 B2  10/2007 Kuwazawa et al.
7,364,960 B2 * 4/2008 Lyu ................. H10F 39/802
                                              257/E21.189
(Continued)

FOREIGN PATENT DOCUMENTS

JP     2016-21479 A    2/2016
KR     10-0594282 B1   6/2006
(Continued)

OTHER PUBLICATIONS

Notice of Allowance issued on Nov. 17, 2025 issued by the Korean Patent Offce in Korean Patent Application No. 10-2022-0052884.

*Primary Examiner* — Scott B Geyer
(74) *Attorney, Agent, or Firm* — Sughrue Mion, PLLC

(57) ABSTRACT

An image sensor is provided. The image sensor includes: a semiconductor substrate including a photoelectric conversion region; a buried transmission gate electrode provided in a transmission gate trench; a fin-type active region provided between a first trench and a second trench which extend into the semiconductor substrate, wherein the fin-type active region includes a first source/drain region, a second source/drain region, and a channel region provided between the first and second source/drain regions; and a first gate electrode covering a top surface and both sidewalls of the fin-type active region, and inner walls of the first trench and the second trench. The channel region, the first source/drain region and the second source/drain region each have a first conductivity type. The photoelectric conversion region and the fin-type active region overlap along a vertical direction.

20 Claims, 26 Drawing Sheets

(52) U.S. Cl.
CPC ..... *H10F 39/80377* (2025.01); *H10F 39/807* (2025.01); *H10F 39/811* (2025.01); *H10F 39/199* (2025.01); *H10F 39/8037* (2025.01); *H10F 39/8053* (2025.01); *H10F 39/812* (2025.01)

(58) Field of Classification Search
CPC ...... H10F 39/014; H10F 39/18; H10F 39/199; H10F 39/8033; H10F 39/8037; H10F 39/8053; H10F 39/807; H10F 39/811; H10D 30/668; H10D 30/658; H10D 64/025–027; H10D 30/0275; H10D 30/6894; H10D 30/699; H10D 64/513
See application file for complete search history.

(56) References Cited

U.S. PATENT DOCUMENTS

| | | | |
|---|---|---|---|
| 7,394,116 | B2 | 7/2008 | Kim et al. |
| 7,535,037 | B2 | 5/2009 | Lyu |
| 7,863,658 | B2 | 1/2011 | Ho et al. |
| 8,754,359 | B2 | 6/2014 | Yu et al. |
| 8,809,990 | B2 | 8/2014 | Maeda et al. |
| 9,443,900 | B2 | 9/2016 | Yamashita |
| 10,937,820 | B2 | 3/2021 | Kudoh |
| 11,404,460 | B2 | 8/2022 | Chen et al. |
| 2006/0084195 | A1* | 4/2006 | Lyu ............... H10F 39/803 257/E27.131 |
| 2016/0056201 | A1 | 2/2016 | Yamashita |
| 2017/0338264 | A1* | 11/2017 | Kwag ............. H10F 39/80373 |
| 2018/0190699 | A1* | 7/2018 | Lee ................ H10F 39/192 |
| 2019/0123079 | A1* | 4/2019 | Kudoh ............... H10D 64/513 |
| 2020/0135777 | A1 | 4/2020 | Zhao et al. |
| 2021/0193715 | A1 | 6/2021 | McCarten |
| 2021/0305297 | A1 | 9/2021 | Tian et al. |
| 2021/0305298 | A1 | 9/2021 | Hu et al. |
| 2021/0305299 | A1 | 9/2021 | Huang et al. |
| 2021/0327947 | A1* | 10/2021 | Lin ................ H10D 64/513 |
| 2021/0384237 | A1 | 12/2021 | Yamakawa |
| 2021/0391366 | A1 | 12/2021 | Fukasaku et al. |
| 2022/0020792 | A1* | 1/2022 | Kimizuka ........... H10D 64/668 |
| 2022/0059599 | A1* | 2/2022 | Wang ............... H10F 39/803 |
| 2022/0165768 | A1* | 5/2022 | Kim ................ H10F 39/80373 |
| 2022/0302191 | A1* | 9/2022 | Jin ................ H10F 39/811 |
| 2022/0328545 | A1* | 10/2022 | Zang ............... H10F 39/802 |
| 2022/0375977 | A1* | 11/2022 | Zang ............... H10F 39/80373 |
| 2023/0144105 | A1* | 5/2023 | Choi ............... H10F 39/80373 257/440 |
| 2023/0343800 | A1* | 10/2023 | Chang ............. H10F 39/014 |
| 2024/0258357 | A1* | 8/2024 | Kaneyasu ......... H10F 39/80373 |
| 2024/0290816 | A1* | 8/2024 | Nakamoto ......... H10F 39/199 |

FOREIGN PATENT DOCUMENTS

| | | |
|---|---|---|
| KR | 10-0644019 B1 | 11/2006 |
| KR | 10-2013-058402 A | 6/2013 |
| KR | 10-2013-0058402 A | 6/2013 |
| KR | 10-2016-0091244 A | 8/2016 |
| KR | 10-2018-0015378 A | 2/2018 |
| KR | 10-2020-0131070 A | 11/2020 |
| KR | 10-2021-0089564 A | 7/2021 |
| WO | 2020/075583 A1 | 4/2020 |
| WO | 2020/090403 A1 | 5/2020 |

* cited by examiner

IMAGE SENSORS

CROSS-REFERENCE TO RELATED APPLICATIONS

This application is based on and claims priority to Korean Patent Application Nos. 10-2022-0015765, filed on Feb. 7, 2022, 10-2022-0033437, filed on Mar. 17, 2022, and 10-2022-0052884, filed on Apr. 28, 2022, in the Korean Intellectual Property Office, the disclosures of which are incorporated by reference herein in their entireties.

BACKGROUND

The present disclosure relates to an image sensor, and more particularly, to an image sensor including a photodiode.

An image sensor is a device that converts an optical image signal into an electrical signal. The image sensor includes a plurality of pixels, and each pixel includes a photodiode region that receives incident light and converts incident light into an electric signal, and a pixel circuit that outputs a pixel signal using electric charges generated by the photodiode region. As the degree of integration of an image sensor increases, the size of each pixel decreases and the size of each component of a pixel circuit also decreases, and thus, a leakage current occurs through the pixel circuit, thereby deteriorating the quality of the image sensor.

SUMMARY

One or more example embodiments provide an image sensor having improved image quality by reducing read noise of a pixel circuit.

According to an aspect of an example embodiment, an image sensor includes: a semiconductor substrate including a first surface, a second surface opposite to the first surface, and a photoelectric conversion region provided between the first surface and the second surface; a buried transmission gate electrode provided in a transmission gate trench which extends into the semiconductor substrate from the first surface of the semiconductor substrate; a fin-type active region provided between a first trench and a second trench which extend from the first surface of the semiconductor substrate into the semiconductor substrate, wherein the fin-type active region includes a first source/drain region, a second source/drain region, and a channel region provided between the first source/drain region and the second source/drain region; and a first gate electrode covering a top surface and both sidewalls of the fin-type active region, and inner walls of the first trench and the second trench. The channel region, the first source/drain region and the second source/drain region each have a first conductivity type, and the photoelectric conversion region and the fin-type active region overlap along a direction perpendicular to the first surface of the semiconductor substrate.

According to an aspect of an example embodiment, an image sensor includes: a semiconductor substrate including a first surface, a second surface opposite to the first surface, and a photoelectric conversion region provided between the first surface and the second surface; a buried transmission gate electrode provided in a transmission gate trench which extends into the semiconductor substrate from the first surface of the semiconductor substrate; a fin-type active region provided between a first trench and a second trench which extend into the semiconductor substrate from the first surface of the semiconductor substrate, wherein the fin-type active region includes a first portion which extends in a first direction parallel to the first surface of the semiconductor substrate, a second portion which extends in a second direction parallel to the first surface of the semiconductor substrate and different from the first direction, a bent portion connected between the first portion and the second portion, and an n-type impurity; and a first gate electrode covering a top surface and both sidewalls of the fin-type active region.

According to an aspect of an example embodiment, an image sensor includes: a semiconductor substrate including a first surface, a second surface opposite to the first surface, a plurality of pixels separated by pixel trenches formed in the semiconductor substrate, and photoelectric conversion regions provided in the plurality of pixels, respectively; a buried transmission gate electrode provided in a transmission gate trench which extends into the semiconductor substrate from the first surface of the semiconductor substrate; a floating diffusion region provided on one edge portion of the buried transmission gate electrode in the semiconductor substrate; a fin-type active region provided between a first trench and a second trench which extend into the semiconductor substrate from the first surface of the semiconductor substrate, wherein the fin-type active region includes a first portion which extends in a first direction parallel to the first surface of the semiconductor substrate, a second portion which extends in a second direction parallel to the first surface of the semiconductor substrate and different from the first direction, a bent portion connected between the first portion and the second portion, and an n-type impurity; a first gate electrode provided in the first trench and the second trench, covering a top surface and both sidewalls of the fin-type active region, and including a first gate portion covering the first portion of the fin-type active region, a second gate portion covering the second portion of the fin-type active region, and a gate bent portion covering the bent portion of the fin-type active region; and a lower barrier region provided between a bottom of the fin-type active region and the photoelectric conversion regions.

BRIEF DESCRIPTION OF THE DRAWINGS

The above and other aspects and features will be more apparent from the following description of example embodiments taken in conjunction with the accompanying drawings, in which.

DETAILED DESCRIPTION

Hereinafter, example embodiments are described in conjunction with the accompanying drawings. Embodiments described herein are example embodiments, and thus, the present disclosure is not limited thereto, and may be realized in various other forms. Each example embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. It will be also understood that, even if a certain step or operation of manufacturing an apparatus or structure is described later than another step or operation, the step or operation may be performed later than the other step or operation unless the other step or operation is described as being performed after the step or operation.

Figure 1:
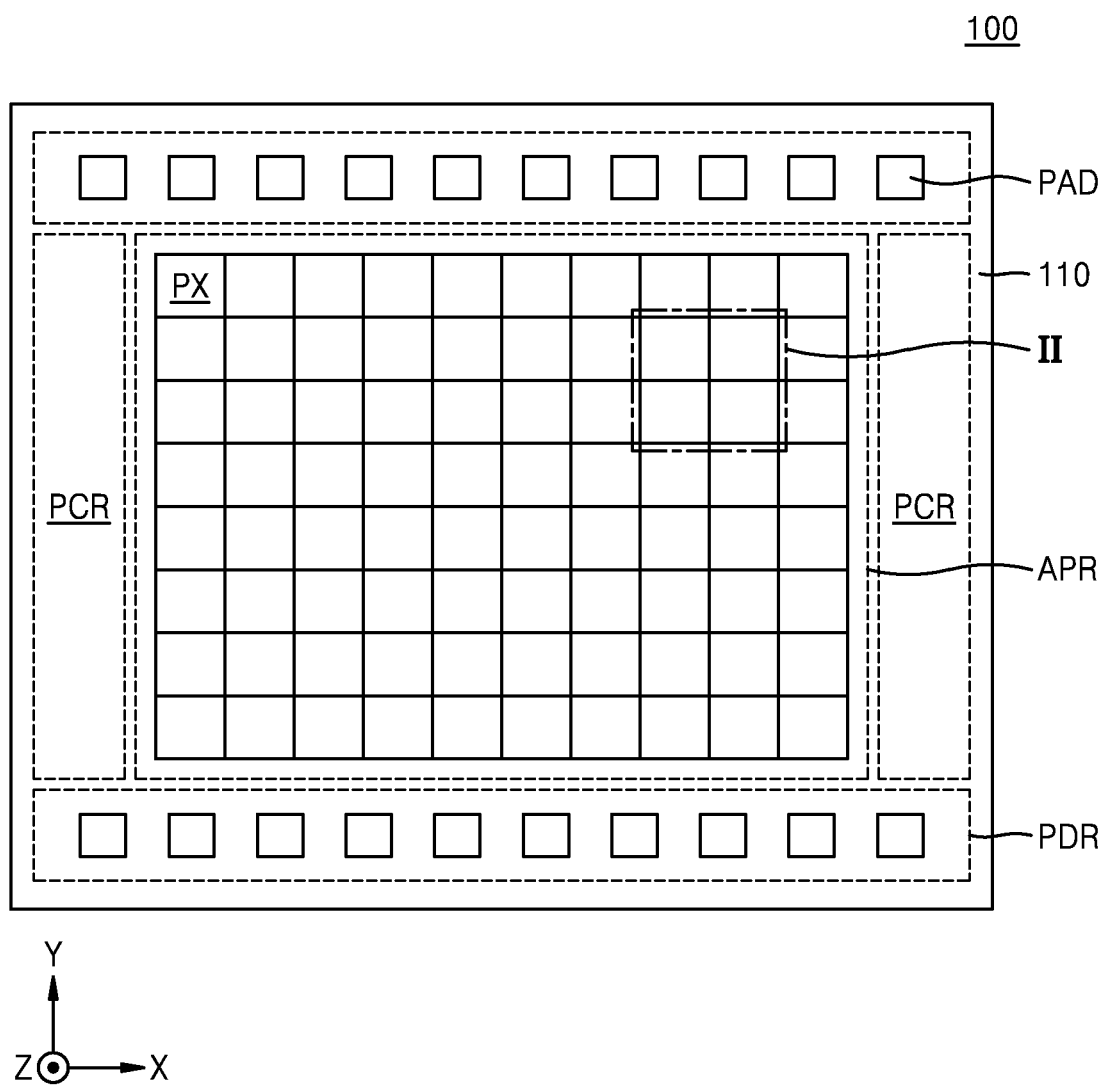
FIG. 1 is a layout diagram showing an image sensor according to example embodiments.
Figure 2:
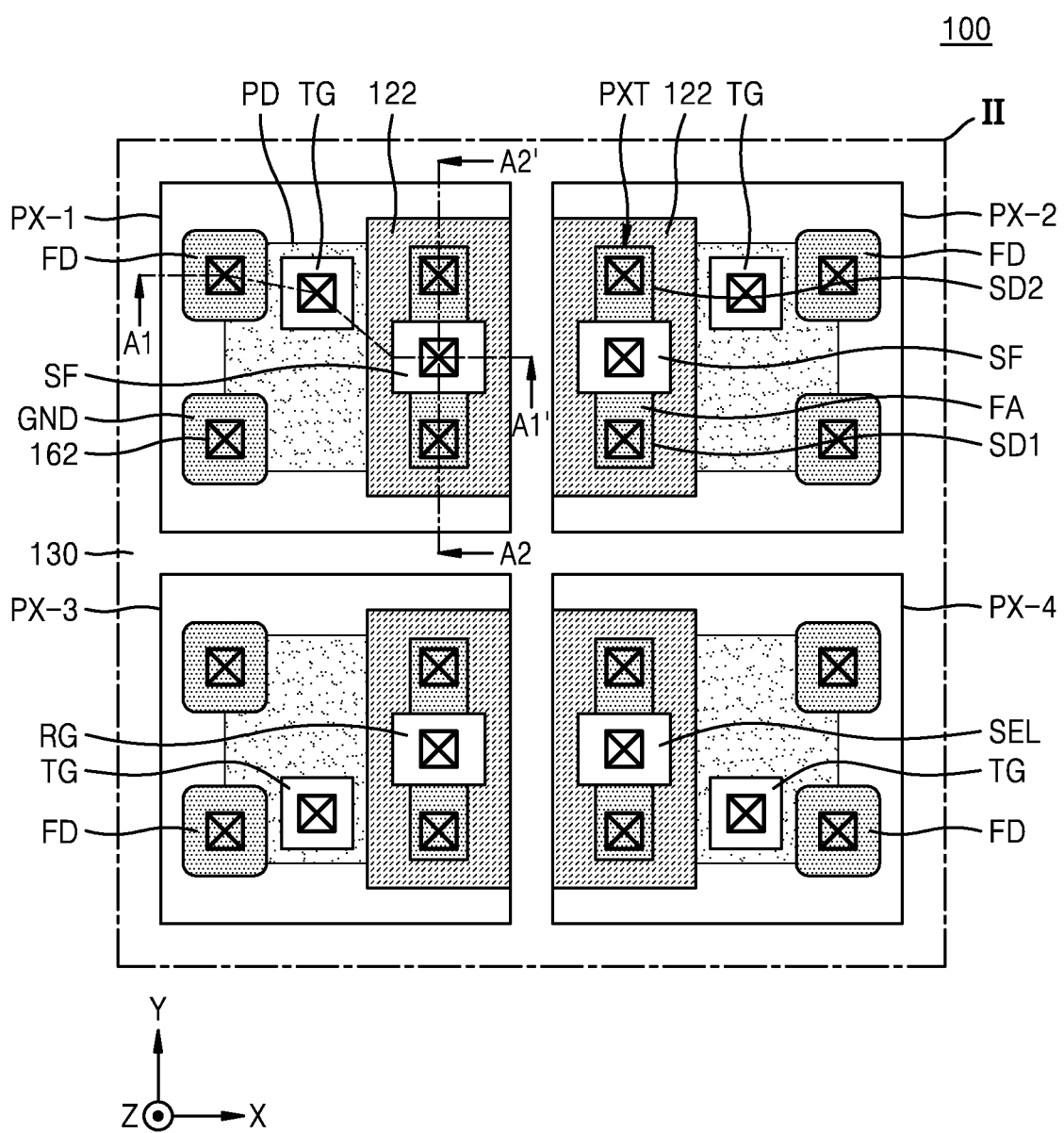
FIG. 2 is an enlarged layout view of portion II of FIG. 1.
Figure 3:
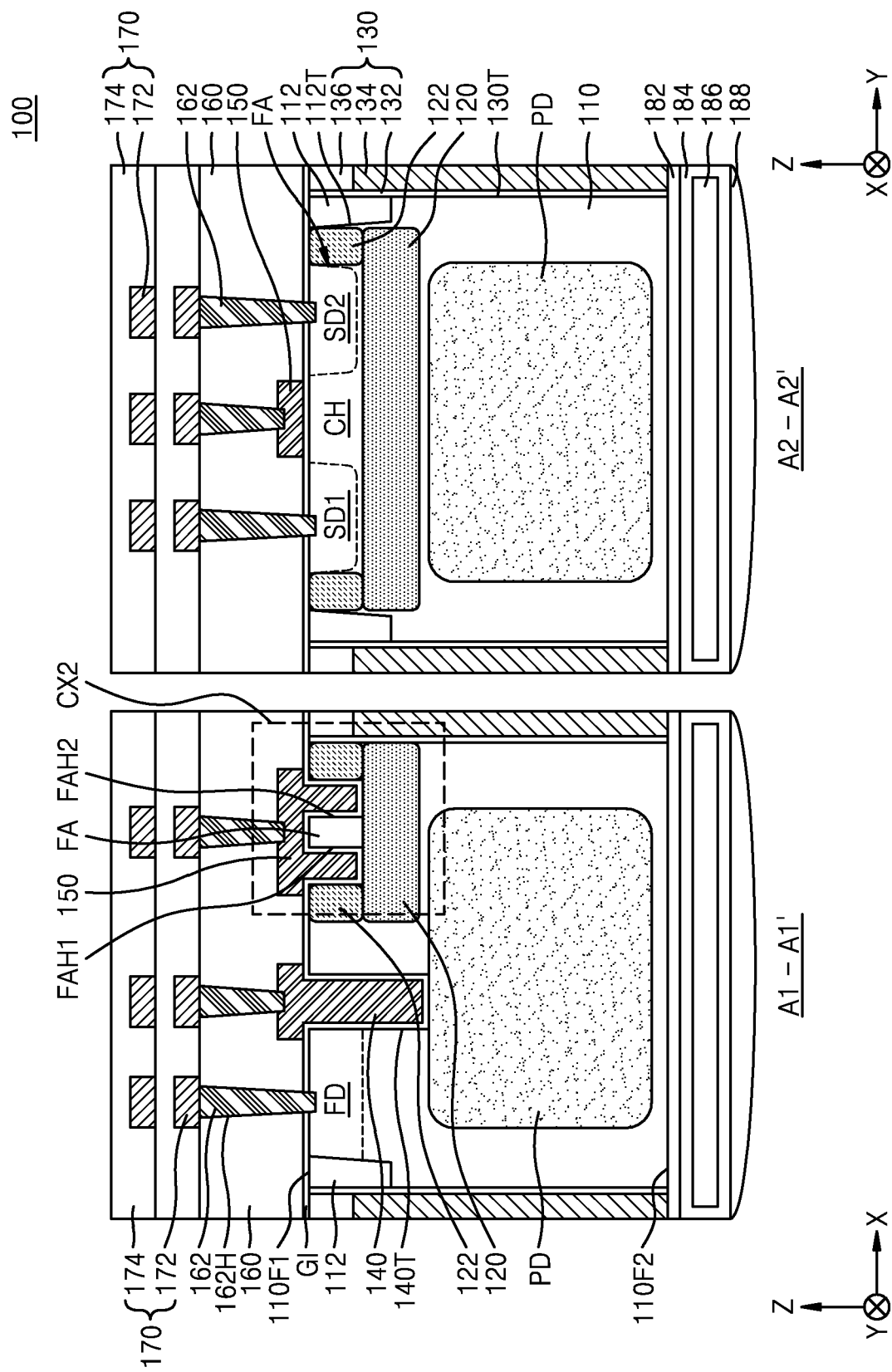
FIG. 3 is a cross-sectional view taken along lines A1-A1' and A2-A2' of FIG. 2.
Figure 4:
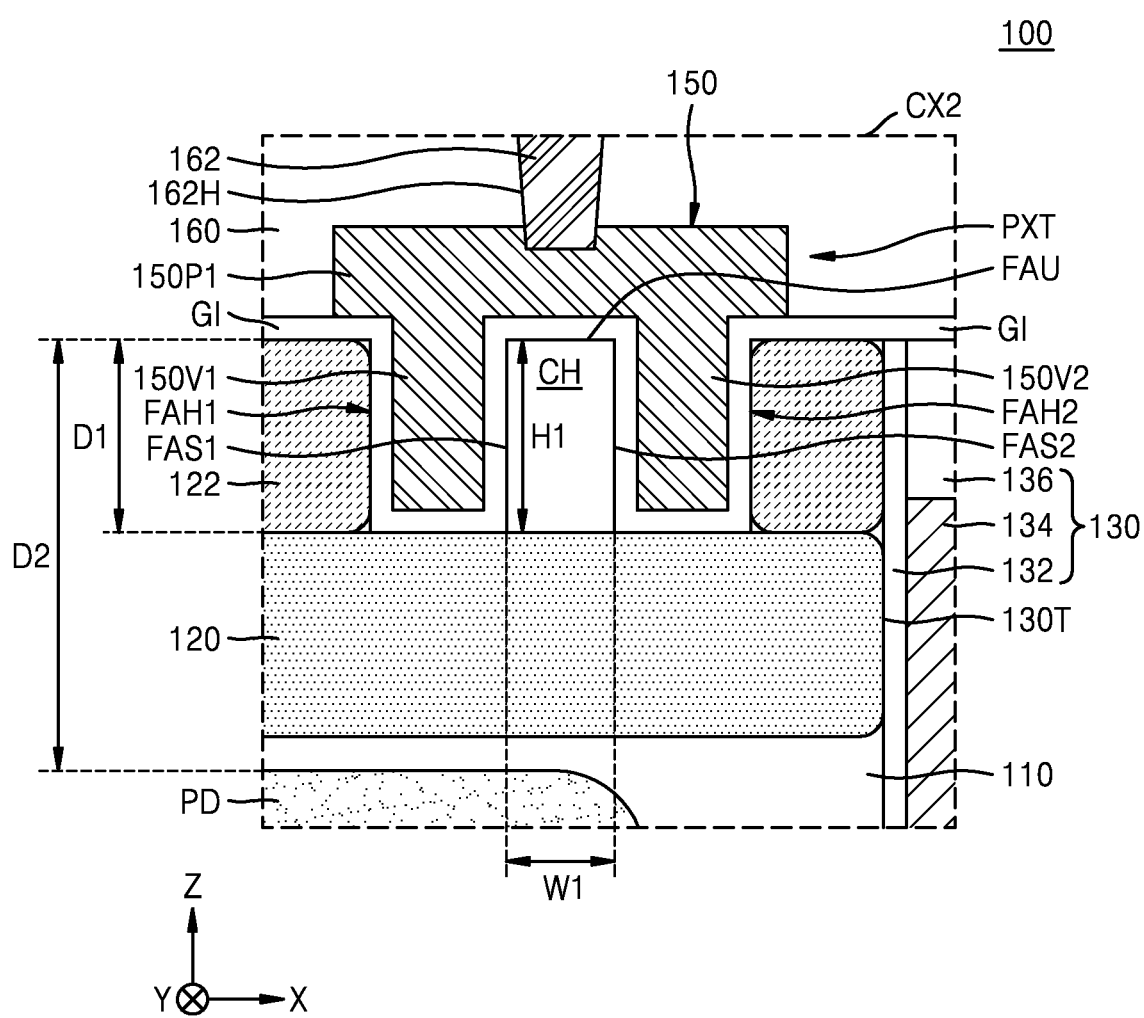
FIG. 4 is an enlarged view of portion CX2 of FIG. 3.

FIG. 1 is a layout diagram showing an image sensor 100 according to example embodiments. FIG. 2 is an enlarged layout view of portion II of FIG. 1. FIG. 3 is a cross-sectional view taken along lines A1-A1' and A2-A2' of FIG. 2. FIG. 4 is an enlarged view of portion CX2 of FIG. 3.

Referring to FIGS. 1 to 4, the image sensor 100 may include an active pixel region APR, peripheral circuit regions PCR, and pad regions PDR formed on a semiconductor substrate 110.

The active pixel region APR may be disposed in the central portion of the semiconductor substrate 110, and the peripheral circuit regions PCR may be arranged on both sides of the active pixel region APR. The pad regions PDR may be arranged at edge portions of the semiconductor substrate 110.

The active pixel region APR includes a plurality of pixels PX, and a plurality of photoelectric conversion regions PD may be arranged in the pixels PX, respectively. In the active pixel region APR, the pixels PX may be arranged in columns and rows in a first direction X parallel to the top surface of the semiconductor substrate 110 and a second direction Y perpendicular to the first direction X and parallel to the top surface of the semiconductor substrate 110. For example, the pixels PX may be arranged in a matrix-like form.

Figure 25:
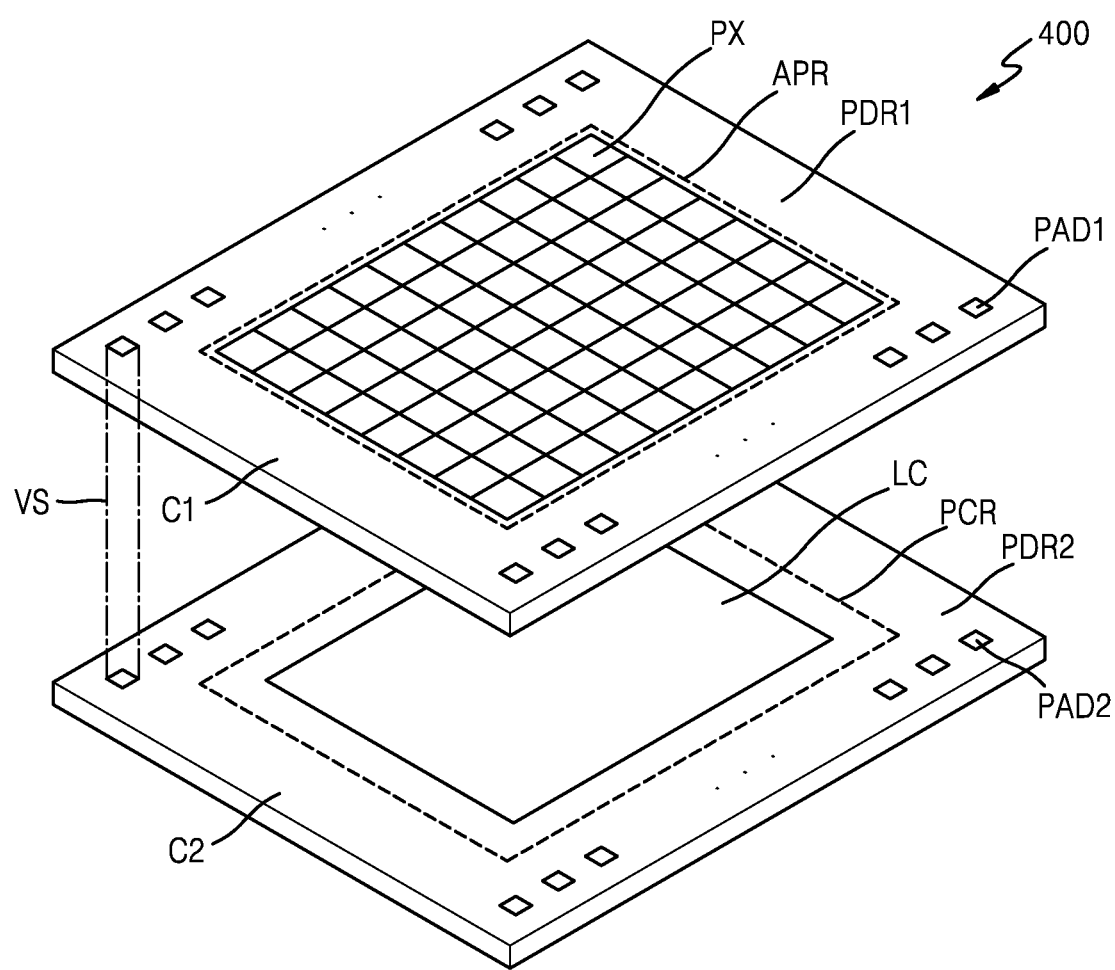
FIG. 25 is a schematic view of an image sensor according to example embodiments.

Although an example in which the peripheral circuit regions PCR are arranged on both sides of the active pixel region APR when viewed from above is shown, example embodiments are not limited thereto, and a peripheral circuit region PCR may be arranged to surround the entire active pixel region APR. Alternatively, as shown in FIG. 25, the peripheral circuit region PCR may be formed on another substrate and connected to a substrate, on which the active pixel region APR is formed, in a stack form. Conductive pads PAD may be arranged in the pad regions PDR. The conductive pads PAD may be arranged on edge portions of the semiconductor substrate 110.

The semiconductor substrate 110 may include a first surface 110F1 and a second surface 110F2 opposite to each other. Hereinafter, for convenience of explanation, a surface of the semiconductor substrate 110, on which a color filter 186 is arranged, is referred to as the second surface 110F2, and a surface of the semiconductor substrate 110, opposite to the second surface 110F2, is referred to as the first surface 110F1. However, example embodiments are not limited thereto.

According to example embodiments, the semiconductor substrate 110 may include a p-type semiconductor substrate. For example, the semiconductor substrate 110 may include any one of Si, Ge, SiGe, SiC, GaAs, InAs, and InP. For example, the semiconductor substrate 110 may include a p-type silicon substrate. According to example embodiments, the semiconductor substrate 110 may include a p-type bulk substrate and a p-type or n-type epitaxial layer grown thereon. According to other example embodiments, the semiconductor substrate 110 may include an n-type bulk substrate and a p-type or n-type epitaxial layer grown thereon. Alternatively, the semiconductor substrate 110 may include an organic plastic substrate. A well region may be disposed in the semiconductor substrate 110 adjacent to the first surface 110F1 of the semiconductor substrate 110. The well region may be a region doped with a p-type impurity.

The pixels PX may be arranged in a matrix-like form in the semiconductor substrate 110 in the active pixel region APR. The photoelectric conversion regions PD may be arranged in the pixels PX, respectively. The photoelectric conversion regions PD may be regions in which light incident on the second surface 110F2 of the semiconductor substrate 110 is converted into an electrical signal. The photoelectric conversion regions PD may be regions including an n-type impurity.

A pixel device isolation layer 130 may be disposed in the semiconductor substrate 110 in the active pixel region APR, and the pixels PX may be defined by the pixel device isolation layer 130. The pixel device isolation layer 130 may be disposed between one of the photoelectric conversion regions PD and the photoelectric conversion region PD adjacent thereto. One photoelectric conversion region PD and another photoelectric conversion region PD adjacent thereto may be physically and electrically separated by the pixel device isolation layer 130. The pixel device isolation layer 130 is disposed between the photoelectric conversion regions PD arranged in a matrix-like form and may have a grid or mesh-like shape when viewed from above.

The pixel device isolation layer 130 may be formed in a pixel trench 130T penetrating through the semiconductor substrate 110 from the first surface 110F1 to the second surface 110F2 of the semiconductor substrate 110. The pixel device isolation layer 130 may include an insulation layer 132 conformally formed on sidewalls of the pixel trench 130T, a conductive layer 134 on the insulation layer 132 and filling the inside of the pixel trench 130T, and an upper insulation layer 136. The upper insulation layer 136 may be disposed in a portion of the pixel trench 130T adjacent to the first surface 110F1 of the semiconductor substrate 110.

According to example embodiments, the pixel trench 130T may be formed to extend into the semiconductor substrate 110 from the first surface 110F1 of the semiconductor substrate 110 toward the second surface 110F2, the insulation layer 132 and the conductive layer 134 may be sequentially formed in the pixel trench 130T, and the upper insulation layer 136 may be formed by etching portions of the insulation layer 132 and the conductive layer 134 arranged at the entrance of the pixel trench 130T and filling the remaining space of the pixel trench 130T with an insulation material. According to other example embodiments, the pixel trench 130T may be formed to extend from the second surface 110F2 of the semiconductor substrate 110 toward the first surface 110F1 of the semiconductor substrate 110 into the semiconductor substrate 110, and then the insulation layer 132 and the conductive layer 134 may be sequentially formed in the pixel trench 130T. The expression that the pixel trench 130T or the pixel device isolation layer 130 extends from the first surface 110F1 to the second surface 110F2 of the semiconductor substrate 110 may be understood to include both the case in which the pixel trench 130T is formed to extend from the first surface 110F1 of the semiconductor substrate 110 toward the second surface 110F2 of the semiconductor substrate 110 and the case in which the pixel trench 130T extends from the second surface 110F2 toward the first surface 110F1 of the semiconductor substrate 110.

According to example embodiments, the insulation layer 132 may include a metal oxide, such as hafnium oxide, aluminum oxide, tantalum oxide, etc. In this case, the insulation layer 132 may serve as a negative fixed charge layer, but example embodiments are not limited thereto. According to other example embodiments, the insulation layer 132 may include an insulating material, such as silicon oxide, silicon nitride, or silicon oxynitride. The conductive layer 134 may include at least one of doped polysilicon, a metal, a metal silicide, a metal nitride, and a metal-containing layer.

Although FIG. 3 shows that the pixel device isolation layer 130 extends from the first surface 110F1 to the second surface 110F2 of the semiconductor substrate 110 through the semiconductor substrate 110, according to other example embodiments, the pixel device isolation layer 130 may extend from the second surface 110F2 of the semiconductor substrate 110 toward the inside of the semiconductor substrate 110 and may not be exposed from the first surface 110F1 of the semiconductor substrate 110. In this case, a barrier doped region may be formed between the first surface 110F1 of the semiconductor substrate 110 and one edge of the pixel device isolation layer 130 adjacent to the first surface 110F1 of the semiconductor substrate 110, and the barrier doped region may be a region densely doped with a p-type impurity.

As shown in FIG. 3, a device isolation layer 112 defining an active region may be formed on the first surface 110F1 of the semiconductor substrate 110. The device isolation layer 112 may be disposed in a device isolation trench 112T formed in the first surface 110F1 of the semiconductor substrate 110 to a certain depth and may include an insulation material. The device isolation layer 112 may be disposed to surround upper sidewalls of the pixel device isolation layer 130 (e.g., sidewalls of the upper insulation layer 136).

Transistors constituting a pixel circuit may be arranged in the active region. The active region may be a portion of the semiconductor substrate 110, wherein a transmission gate TG, a source follower gate SF, a selection gate SEL, and a reset gate RG are arranged in the active region. For example, the active region may include a ground region GND, a floating diffusion region FD, and a fin-type active region FA. The ground region GND, the floating diffusion region FD, and the fin-type active region FA may be arranged to be spaced apart from each other by the device isolation layer 112.

According to some example embodiments, as shown in FIG. 2, a first pixel PX-1, a second pixel PX-2, a third pixel PX-3, and a fourth pixel PX-4 may be arranged in a matrix-like form, the first pixel PX-1 and the third pixel PX-3 arranged side-by-side in the second direction Y may have shapes mirror-symmetrical to each other, and the first pixel PX-1 and the second pixel PX-2 arranged side-by-side in the first direction X may have shapes mirror-symmetrical to each other.

According to some example embodiments, the first pixel PX-1 and the second pixel PX-2 may each include the transmission gate TG and the source follower gate SF, the third pixel PX-3 may include the transmission gate TG and the reset gate RG, and the fourth pixel PX-4 may include the transmission gate TG and the selection gate SEL. However, the layouts of transistors shown in FIG. 2 correspond to the layouts of transistors according to some example embodiments, and the layout of transistors or the shape of the active region is not limited thereto.

According to example embodiments, the transmission gate TG may constitute a transmission transistor TX (refer to FIG. 5), and the transmission transistor TX may be configured to transmit charges generated by the photoelectric conversion region PD to the floating diffusion region FD. The reset gate RG may constitute a reset transistor RX (refer to FIG. 5), and the reset transistor RX may be configured to periodically reset charges stored in the floating diffusion region FD. The source follower gate SF may constitute a drive transistor DX (refer to FIG. 5), and the drive transistor DX may be configured to serve as a source follower buffer amplifier and buffer signals according to charges stored in the floating diffusion region FD. The selection gate SEL may constitute a selection transistor SX (refer to FIG. 5), and the selection transistor SX may perform switching and addressing for selecting the pixel PX.

The transmission gate TG may be referred to as a buried transmission gate electrode 140, and as shown in FIG. 3, the buried transmission gate electrode 140 may be disposed in a transmission gate trench 140T extending from the first surface 110F1 of the semiconductor substrate 110 into the semiconductor substrate 110. A gate insulation layer GI may be conformally disposed on the inner walls of the transmission gate trench 140T, and the buried transmission gate electrode 140 may fill the inside of the transmission gate trench 140T on the gate insulation layer GI.

For example, the top surface of the buried transmission gate electrode 140 may be at a higher level than the first surface 110F1 of the semiconductor substrate 110. For example, the buried transmission gate electrode 140 may extend onto the first surface 110F1 of the semiconductor substrate 110. According to example embodiments, the buried transmission gate electrode 140 may include at least one of doped polysilicon, a metal, a metal silicide, a metal nitride, and a metal-containing layer. The gate insulation layer GI may include silicon oxide or a metal oxide.

A pixel transistor PXT may be provided in a pixel PX and may be a finFET transistor having a single fin structure. For example, the reset gate RG, the source follower gate SF, and the selection gate SEL may constitute finFET transistors having a single fin structure. The pixel transistor PXT may include a first gate electrode 150 disposed in the fin-type active region FA.

The first gate electrode 150 may be disposed to cover the fin-type active region FA defined by a first trench FAH1 and a second trench FAH2 extending from the first surface 110F1 of the semiconductor substrate 110 into the semiconductor substrate 110. The fin-type active region FA may be disposed to overlap the photoelectric conversion region PD in a vertical direction Z, and the first gate electrode 150 may be disposed on a top surface FAU, a first sidewall FAS1, and a second sidewall FAS2 of the fin-type active region FA.

As shown in FIG. 4, the first sidewall FAS1 and the second sidewall FAS2 of the fin-type active region FA may be defined by the first trench FAH1 and the second trench FAH2, respectively. For example, the first trench FAH1 and the second trench FAH2 may each be arranged to extend in the second horizontal direction Y. The top surface FAU of the fin-type active region FA may extend in the second horizontal direction Y between the first sidewall FAS1 and the second sidewall FAS2, and may be coplanar with the first surface 110F1 of the semiconductor substrate 110. Although FIGS. 2 to 4 show an example in which the fin-type active region FA is disposed parallel to the pixel device isolation layer 130 adjacent thereto (e.g., disposed to extend in the second horizontal direction Y), the extending direction of the fin-type active region FA is not limited thereto.

The first gate electrode 150 may extend in the first horizontal direction X and be disposed to cover the top surface FAU, the first sidewall FAS1, and the second sidewall FAS2 of the fin-type active region FA. For example, as shown in FIG. 4, the first gate electrode 150 may include a horizontal extension 150P1, a first vertical extension 150V1, and a second vertical extension 150V2. The first vertical extension 150V1 may be disposed inside the first trench FAH1 to cover the first sidewall FAS1 of the fin-type active region FA, and the second vertical extension 150V2 may be disposed inside the second trench FAH2 to cover the second sidewall FAS2 of the fin-type active region FA. The horizontal extension 150P1 may cover the top surface FAU of the fin-type active region FA and may be connected to the first vertical extension 150V1 and the second vertical extension 150V2.

The gate insulation layer GI may be provided between the first gate electrode 150 and the fin-type active region FA. For example, the gate insulation layer GI may be conformally disposed on inner walls of the first trench FAH1 and the second trench FAH2, and may extend onto the first surface 110F1 of the semiconductor substrate 110.

The fin-type active region FA may include a channel region CH, a first source/drain region SD1, and a second source/drain region SD2. For example, the channel region CH may be defined in a portion of the fin-type active region FA covered by the first gate electrode 150, the first source/drain region SD1 may be defined in a portion of the fin-type active region FA disposed at a side of the first gate electrode 150, and the second source/drain region SD2 may be defined in a portion of the fin-type active region FA disposed at another side of the first gate electrode 150. For example, the channel region CH may indicate a portion of the fin-type active region FA that vertically overlaps the first gate electrode 150, and the first source/drain region SD1 and the second source/drain region SD2 may indicate regions respectively at both edges of the fin-type active region FA around the channel region CH therebetween.

According to example embodiments, the channel region CH may have a first conductivity type, and the first source/drain region SD1 and the second source/drain region SD2 may have the first conductivity type, which is the same as that of the channel region CH. For example, the channel region CH may be a region doped with an n-type impurity, and the first source/drain region SD1 and the second source/drain region SD2 may be regions doped with an n-type impurity. As the channel region CH, the first source/drain region SD1, and the second source/drain region SD2 have the same conductivity type, the pixel transistor PXT, including the first gate electrode 150 and the fin-type active region FA, may constitute a junctionless transistor.

The fin-type active region FA may be disposed between the first trench FAH1 and the second trench FAH2, and may have a first height H1 from the first surface 110F1 of the semiconductor substrate 110. According to example embodiments, the first height H1 may be from about 50 nm to about 500 nm. Also, the fin-type active region FA may have a first width W1 in a direction perpendicular to a direction in which the fin-type active region FA extends (e.g., in the first horizontal direction X of FIG. 2), and the first width W1 may be from about 20 nm to about 100 nm.

According to example embodiments, the fin-type active region FA may be formed by forming the first trench FAH1 and the second trench FAH2 having the first height H1 in the vertical direction Z from the first surface 110F1 of the semiconductor substrate 110. FIG. 4 shows an example in which the first sidewall FAS1 and the second sidewall FAS2 of the fin-type active region FA extend in the vertical direction Z, and the fin-type active region FA has the first width W1 substantially constant throughout the height thereof. However, the upper width of each of the first trench FAH1 and the second trench FAH2 may be less than the lower width of each of the first trench FAH1 and the second trench FAH2 according to properties of an etching process used to form the first trench FAH1 and the second trench FAH2. In this case, the first sidewall FAS1 and the second sidewall FAS2 may extend at inclination angles to approach each other toward the upper portion of the fin-type active region FA, and the first width W1 at the top surface of the fin-type active region FA may be less than the first width W1 of the bottom of the fin-type active region FA.

According to example embodiments, the first gate electrode 150 may include at least one of doped polysilicon, a metal, a metal silicide, a metal nitride, and a metal-containing layer.

A lower barrier region 120 may be disposed between the fin-type active region FA and the photoelectric conversion regions PD. The lower barrier region 120 may be a region densely doped with a p-type impurity and may function as a barrier for preventing electrons from moving from the photoelectric conversion regions PD to the fin-type active region FA or from the fin-type active region FA to the photoelectric conversion regions PD. According to example embodiments, the lower barrier region 120 may vertically overlap the fin-type active region FA and the first gate electrode 150, and may be disposed throughout an entire area of the pixel transistor PXT to be connected to the pixel device isolation layer 130. For example, as shown in FIG. 4, the lower barrier region 120 may be disposed to overlap the photoelectric conversion regions PD in the vertical direction Z. The lower barrier region 120 may be disposed to be spaced apart from the photoelectric conversion regions PD in the vertical direction Z, wherein a first distance D1 between the first surface 110F1 of the semiconductor substrate 110 and the lower barrier region 120 in the vertical direction Z may be less than a second distance D2 between the first surface 110F1 of the semiconductor substrate 110 and the photoelectric conversion regions PD in the vertical direction Z.

A lateral barrier region 122 may be disposed around the fin-type active region FA. According to example embodiments, the lateral barrier region 122 may be a region densely doped with a p-type impurity. The lateral barrier region 122 may be disposed to surround the fin-type active region FA and/or the first source/drain region SD1 and the second source/drain region SD2 and may function as a barrier for electrically insulating the pixel transistor PXT from an adjacent region of the semiconductor substrate 110. According to other example embodiments, the lateral barrier region 122 may include an insulation layer having a shallow trench isolation structure and including an insulation material, for complete electrical insulation.

A buried insulation layer 160 may be disposed on the first surface 110F1 of the semiconductor substrate 110. The buried insulation layer 160 may cover the ground region GND, the floating diffusion region FD, the device isolation layer 112, the buried transmission gate electrode 140, the fin-type active region FA, and the first gate electrode 150. The buried insulation layer 160 may be formed to have a sufficient height to cover the fin-type active region FA and the top surface of the first gate electrode 150.

According to example embodiments, the buried insulation layer 160 may include silicon nitride or silicon oxynitride. According to some example embodiments, the buried insulation layer 160 may be formed in a stacked structure of a first insulation layer and a second insulation layer. According to other example embodiments, an etch stop layer may be provided between the buried insulation layer 160 and the first surface 110F1 of the semiconductor substrate 110, and the etch stop layer may include a material having etch selectivity with respect to the buried insulation layer 160.

A contact 162 penetrating through the buried insulation layer 160 may be disposed on the first surface 110F1 of the semiconductor substrate 110. For example, the contact 162 may be formed in a contact hole 162H of the buried insulation layer 160. For example, the contact 162 may penetrate through the buried insulation layer 160 and may be electrically connected to the active region, the buried transmission gate electrode 140, and the first gate electrode 150.

An upper wiring structure 170 may be disposed on the buried insulation layer 160. The upper wiring structure 170 may be formed as a stacked structure of a plurality of layers. The upper wiring structure 170 may include a wiring layer 172 and an insulation layer 174 surrounding the wiring layer 172. The wiring layer 172 may include at least one of polysilicon doped or undoped with an impurity, a metal, a metal silicide, a metal nitride, and a metal-containing layer. For example, the wiring layer 172 may include tungsten, aluminum, copper, tungsten silicide, titanium silicide, tungsten nitride, titanium nitride, doped polysilicon, etc. The insulation layer 174 may include an insulating material, such as silicon oxide, silicon nitride, or silicon oxynitride.

A rear insulation layer 182 may be disposed on the second surface 110F2 of the semiconductor substrate 110. The rear insulation layer 182 may be disposed on substantially all of the second surface 110F2 of the semiconductor substrate 110, and the rear insulation layer 182 may contact the top surface of the pixel device isolation layer 130 disposed at the same level as the second surface 110F2 of the semiconductor substrate 110. According to example embodiments, the rear insulation layer 182 may include a metal oxide, such as hafnium oxide, aluminum oxide, tantalum oxide, etc. According to other example embodiments, the rear insulation layer 182 may include an insulating material, such as silicon oxide, silicon nitride, silicon oxynitride, or a low-k dielectric material.

A passivation layer 184 may be disposed on the rear insulation layer 182, and the color filter 186 and a micro lens 188 may be arranged on the passivation layer 184. Selectively, a support substrate may be further disposed on the first surface 110F1 of the semiconductor substrate 110.

In general, pixel transistors PXT, such as the reset gate RG, the selection gate SEL, and the source follower gate SF arranged in the pixel PX, are horizontally spaced apart from one another in the pixel PX. As the degree of integration of an image sensor increases, the size of a unit pixel decreases and the size of each component of the pixel transistors PXT also decreases. Therefore, a leakage current through the pixel transistor PXT or read noise of a pixel circuit occurs. In particular, when a channel region and a source/drain region have different conductivity types in a related transistor, an interface trap may occur, and thus, a junction leakage current may occur. Therefore, the quality of the image sensor deteriorates.

However, according to example embodiments, the fin-type active region FA is formed by the first trench FAH1 and the second trench FAH2 extending from the first surface 110F1 of the semiconductor substrate 110 into the semiconductor substrate 110, and the first gate electrode 150 may be disposed to cover the top surface FAU, the first sidewall FAS1, and the second sidewall FAS2 of the fin-type active region FA. Therefore, even when the size of the pixel transistor PXT is small, a relatively large effective gate width may be secured and the control ability of a gate for a channel may be improved, and thus, read noise may be reduced and a leakage current of the pixel transistor PXT may be reduced. Also, because the pixel transistor PXT may be configured as a junctionless transistor in which the channel region CH, the first source/drain region SD1, and the second source/drain region SD2 in the fin-type active region FA have the same conductivity type, generation of a junction leakage current may be prevented. Therefore, the image sensor 100 may have improved image quality.

Figure 5:
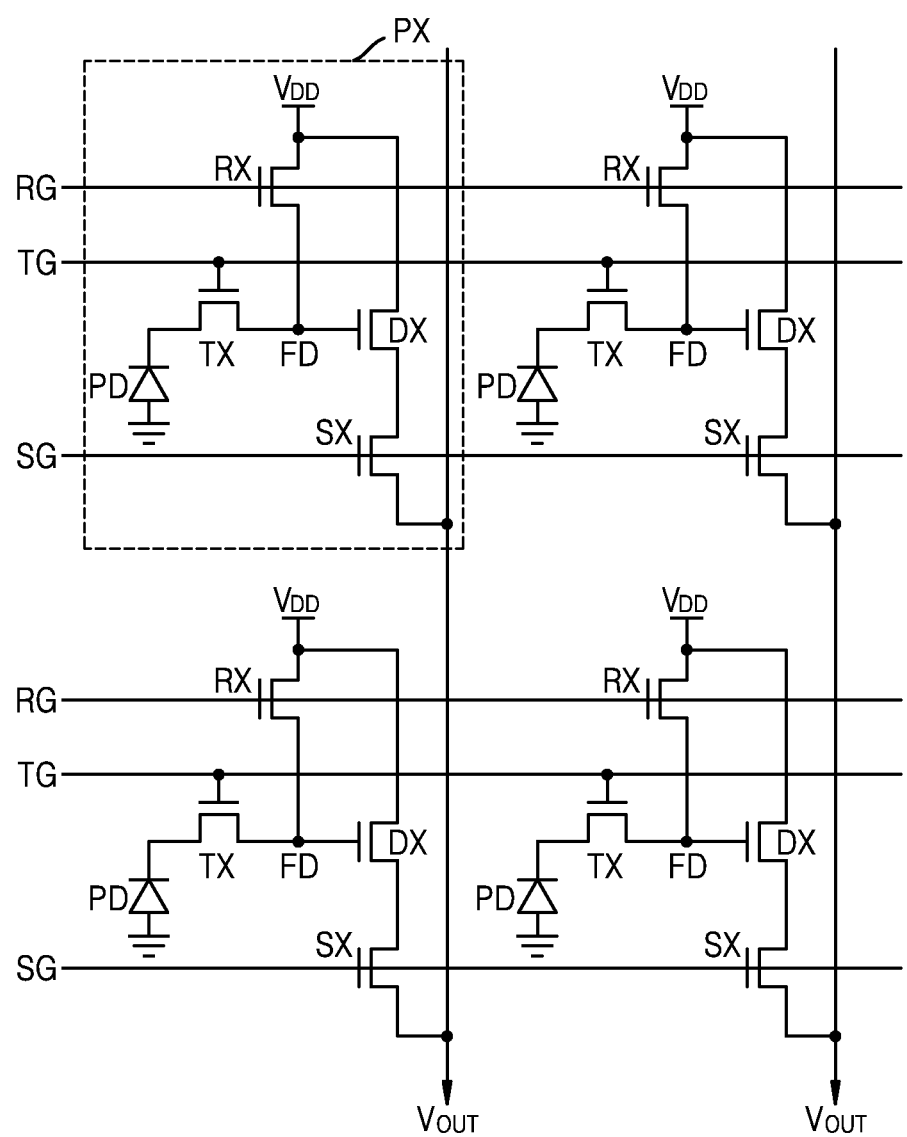
FIG. 5 is an equivalent circuit diagram of pixels of an image sensor according to example embodiments.

FIG. 5 is an equivalent circuit diagram of pixels of the image sensor 100 according to example embodiments.

Referring to FIG. 5, the pixels PX may be arranged in a matrix-like form. The pixels PX may each include the transmission transistor TX and logic transistors. Here, the logic transistors may include a reset transistor RX, a selection transistor SX, and a drive transistor DX (or a source follower transistor). The reset transistor RX may include the reset gate RG, the selection transistor SX may include the selection gate SG, and the transmission transistor TX may include the transmission gate TG.

The pixels PX may each further include a photoelectric conversion region PD and the floating diffusion region FD. The photoelectric conversion region PD may generate and accumulate photocharges in proportion to an amount of light incident thereon, and may include a photodiode, a photo transistor, photo gate, a pinned photodiode (PPD), and combinations thereof.

The transmission transistor TX may transfer charges generated by the photoelectric conversion region PD to the floating diffusion region FD. The floating diffusion region FD may receive and cumulatively store electric charges generated by the photoelectric conversion region PD. The drive transistor DX may be controlled according to an amount of photocharges accumulated in the floating diffusion region FD.

The reset transistor RX may periodically reset charges accumulated in the floating diffusion region FD. A drain electrode of the reset transistor RX is connected to the floating diffusion region FD, and a source electrode is connected to a power voltage VDD. When the reset transistor RX is turned on, the power voltage VDD connected to the source electrode of the reset transistor RX is transferred to the floating diffusion region FD. When the reset transistor RX is turned on, charges accumulated in the floating diffusion region FD are discharged, and thus, the floating diffusion region FD may be reset.

The drive transistor DX is connected to a current source positioned outside the pixels PX, functions as a source follower buffer amplifier, amplifies a potential change in the floating diffusion region FD and outputs the amplified potential change to an output line VOUT.

The selection transistor SX may select the pixels PX row-by-row, and, when the selection transistor SX is turned on, a source electrode of the drive transistor DX may be connected to the output line VOUT.

Figure 6:
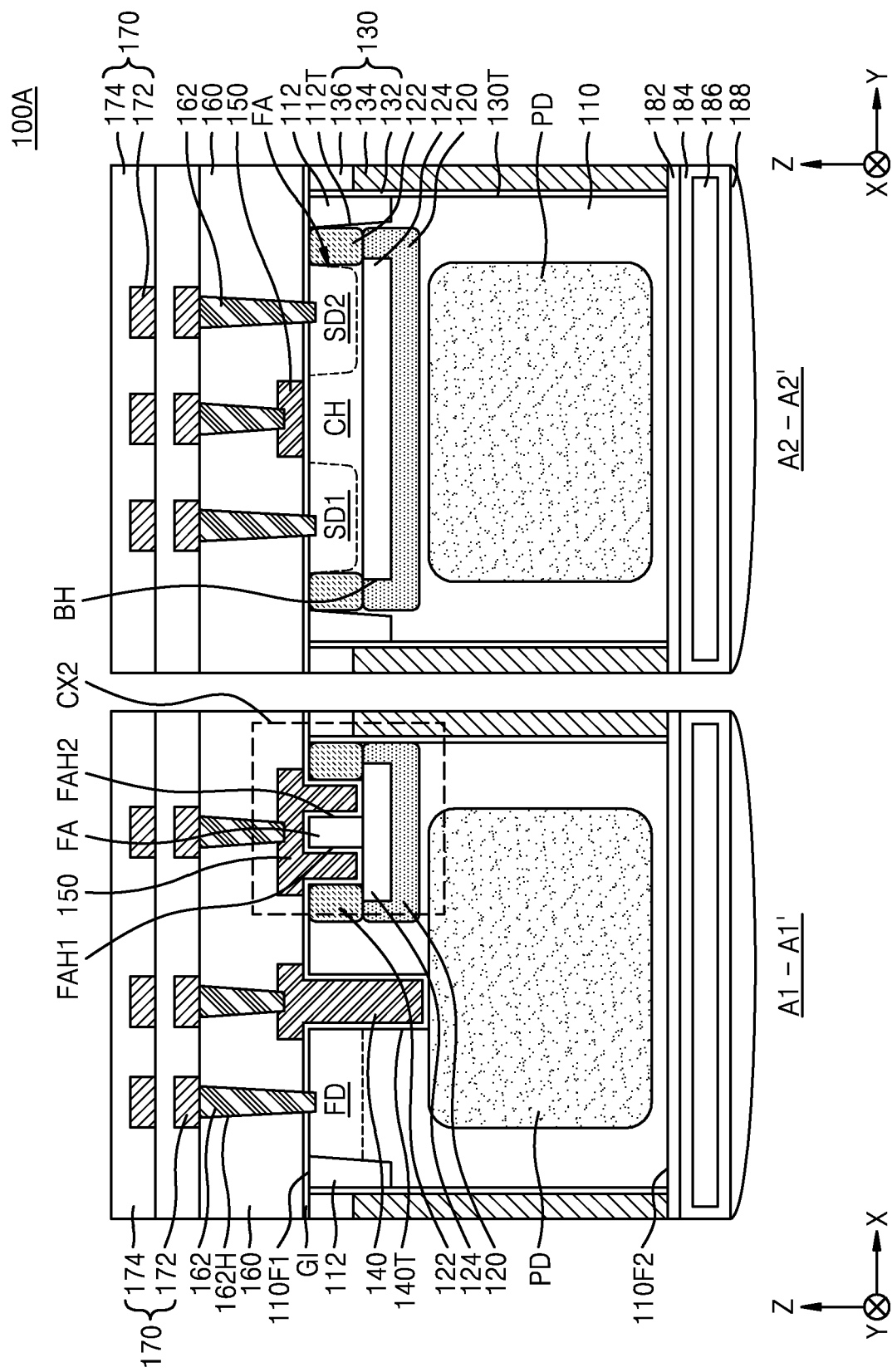
FIG. 6 is a cross-sectional view of an image sensor according to example embodiments.
Figure 7:
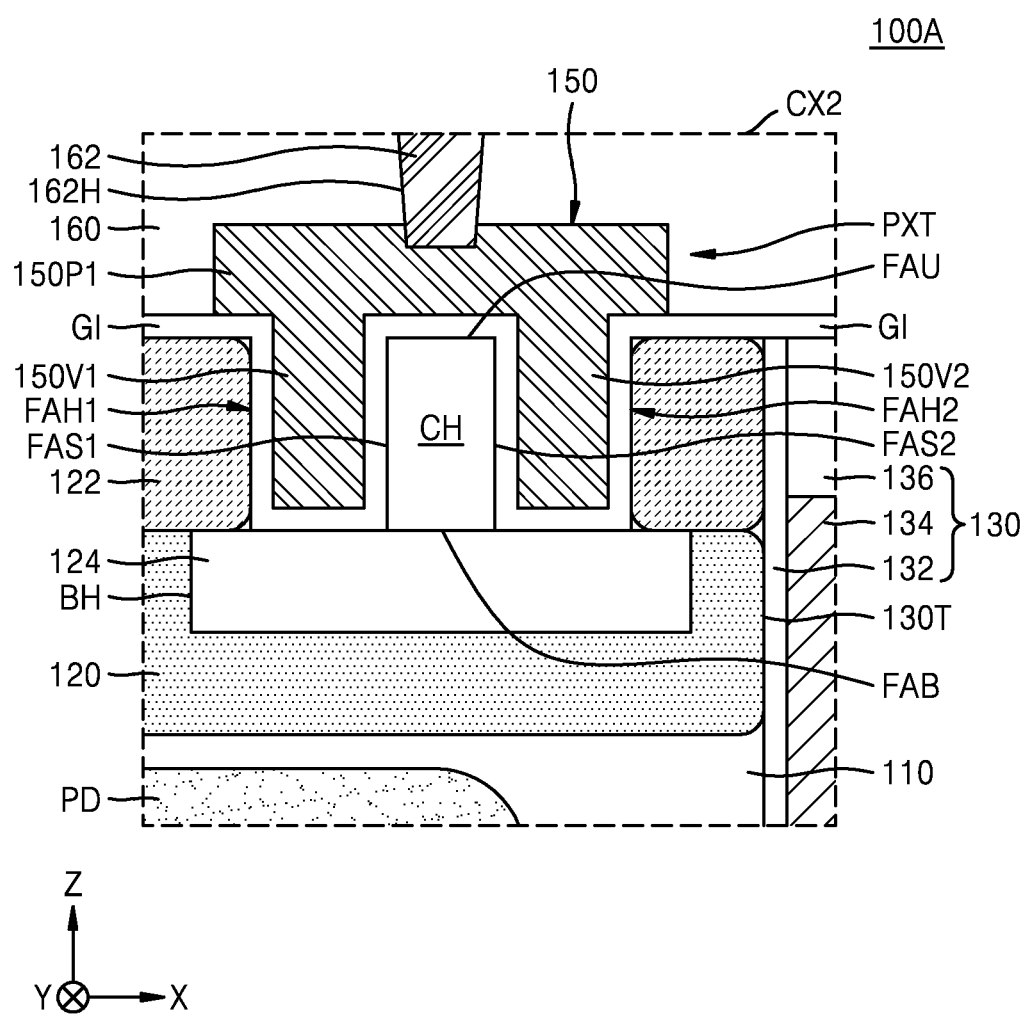
FIG. 7 is an enlarged view of portion CX2 of FIG. 6.

FIG. 6 is a cross-sectional view of an image sensor 100A according to example embodiments. FIG. 7 is an enlarged view of portion CX2 of FIG. 6. In FIGS. 6 and 7, reference numerals that are the same as those in FIGS. 1 to 5 denote the same elements.

Referring to FIGS. 6 and 7, the image sensor 100A may further include a lower insulation layer 124 disposed between the lower barrier region 120 and the fin-type active region FA.

For example, a bottom hole BH may be disposed to vertically overlap both the fin-type active region FA and the first gate electrode 150 between the lower barrier region 120 and the fin-type active region FA. The bottom hole BH may extend in a horizontal direction between the bottom of the first trench FAH1 and the lower barrier region 120 and between the bottom of the second trench FAH2 and the lower barrier region 120. The lower insulation layer 124 may be formed by filling the bottom hole BH with an insulation material. For example, the bottom surface and sidewalls of the lower insulation layer 124 are surrounded by the lower barrier region 120, and the top surface of the lower insulation layer 124 may be in contact with the gate insulation layer GI disposed on the inner walls of the first trench FAH1 and the second trench FAH2. The top surface of the lower insulation layer 124 may contact a bottom surface FAB of the fin-type active region FA and the bottom surface of the lateral barrier region 122.

According to some example embodiments, the lower insulation layer 124 and the gate insulation layer GI may be formed in the same process, and the lower insulation layer 124 may be integrally connected with the gate insulation layer GI. However, example embodiments are not limited thereto.

According to some example embodiments, the bottom hole BH may be formed by extending a portion of the semiconductor substrate 110 exposed at the bottoms of the first trench FAH1 and the second trench FAH2 in lateral directions through an isotropic etching process. Therefore, sidewalls of the bottom hole BH may extend outward with respect to outer sidewalls of the first trench FAH1 and the second trench FAH2. For example, a sidewall of the bottom hole BH may extend horizontally outward with respect to an outer sidewall of the first trench FAH1 (e.g., an outer sidewall of the first trench FAH1 facing the first sidewall FAS1 of the fin-type active region FA), and a sidewall of the bottom hole BH may extend horizontally outward with respect to an outer sidewall of the second trench FAH2 (e.g., an outer sidewall of the second trench FAH2 facing the second sidewall FAS2 of the fin-type active region FA). Also, sidewalls of the lower insulation layer 124 disposed to fill the bottom hole BH may protrude outward with respect to the outer sidewalls of the first trench FAH1 and the second trench FAH2.

Figure 8:
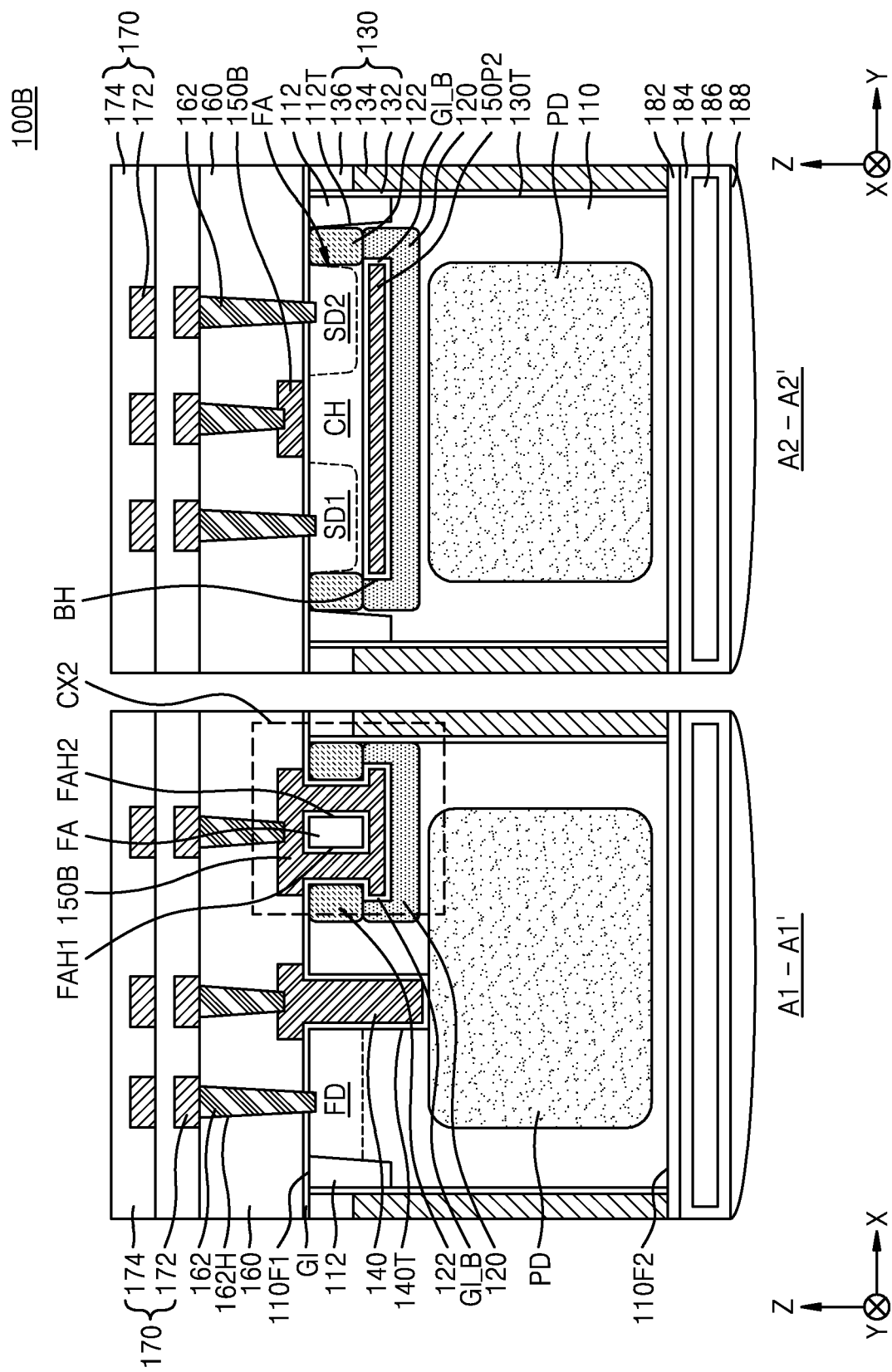
FIG. 8 is a cross-sectional view of an image sensor according to example embodiments.
Figure 9:
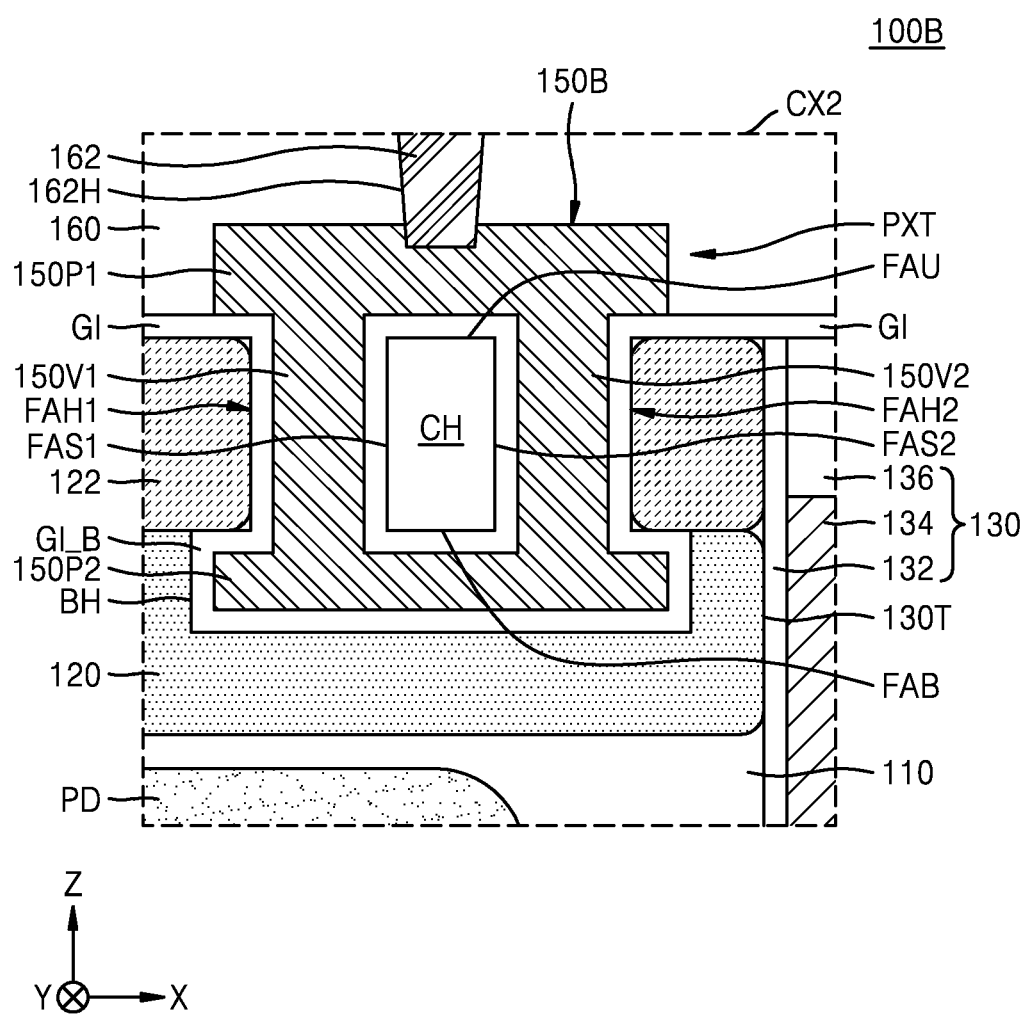
FIG. 9 is an enlarged view of portion CX2 of FIG. 8.

FIG. 8 is a cross-sectional view of an image sensor 100B according to example embodiments. FIG. 9 is an enlarged view of portion CX2 of FIG. 8.

Referring to FIGS. 8 and 9, the pixel transistor PXT may be a gate-all-around-type transistor.

The bottom of the first trench FAH1 and the bottom of the second trench FAH2 may connect with the bottom hole BH. The bottom surface of the fin-type active region FA may be defined by the bottom hole BH. A sidewall of the bottom hole BH may extend horizontally outward with respect to an outer sidewall of the first trench FAH1 (e.g., an outer sidewall of the first trench FAH1 facing the first sidewall FAS1 of the fin-type active region FA), and a sidewall of the bottom hole BH may extend horizontally outward with respect to an outer sidewall of the second trench FAH2 (e.g., an outer sidewall of the second trench FAH2 facing the second sidewall FAS2 of the fin-type active region FA).

A first gate electrode 150B may include a first horizontal extension 150P1, a second horizontal extension 150P2, the first vertical extension 150V1, and the second vertical extension 150V2, wherein the second horizontal extension 150P2 may be connected to the first vertical extension 150V1 and the second vertical extension 150V2, and may be disposed to fill the inside of the bottom hole BH. A bottom gate insulation layer GI_B may be provided between the second horizontal extension 150P2 and the lower barrier region 120 on the inner wall of the bottom hole BH.

According to example embodiments, because the pixel transistor PXT has a gate-all-around structure, a relatively large effective gate width may be secured even when the size of the pixel transistor PXT is small, and the control ability of a gate for a channel may be improved. Therefore, read noise may be reduced and a leakage current of the pixel transistor PXT may be reduced. Also, because the pixel transistor PXT may be configured as a junctionless transistor in which the channel region CH, the first source/drain region SD1, and the second source/drain region SD2 in the fin-type active region FA have the same conductivity type, generation of a junction leakage current may be prevented. Therefore, the image sensor 100B may have improved image quality.

Figure 10:
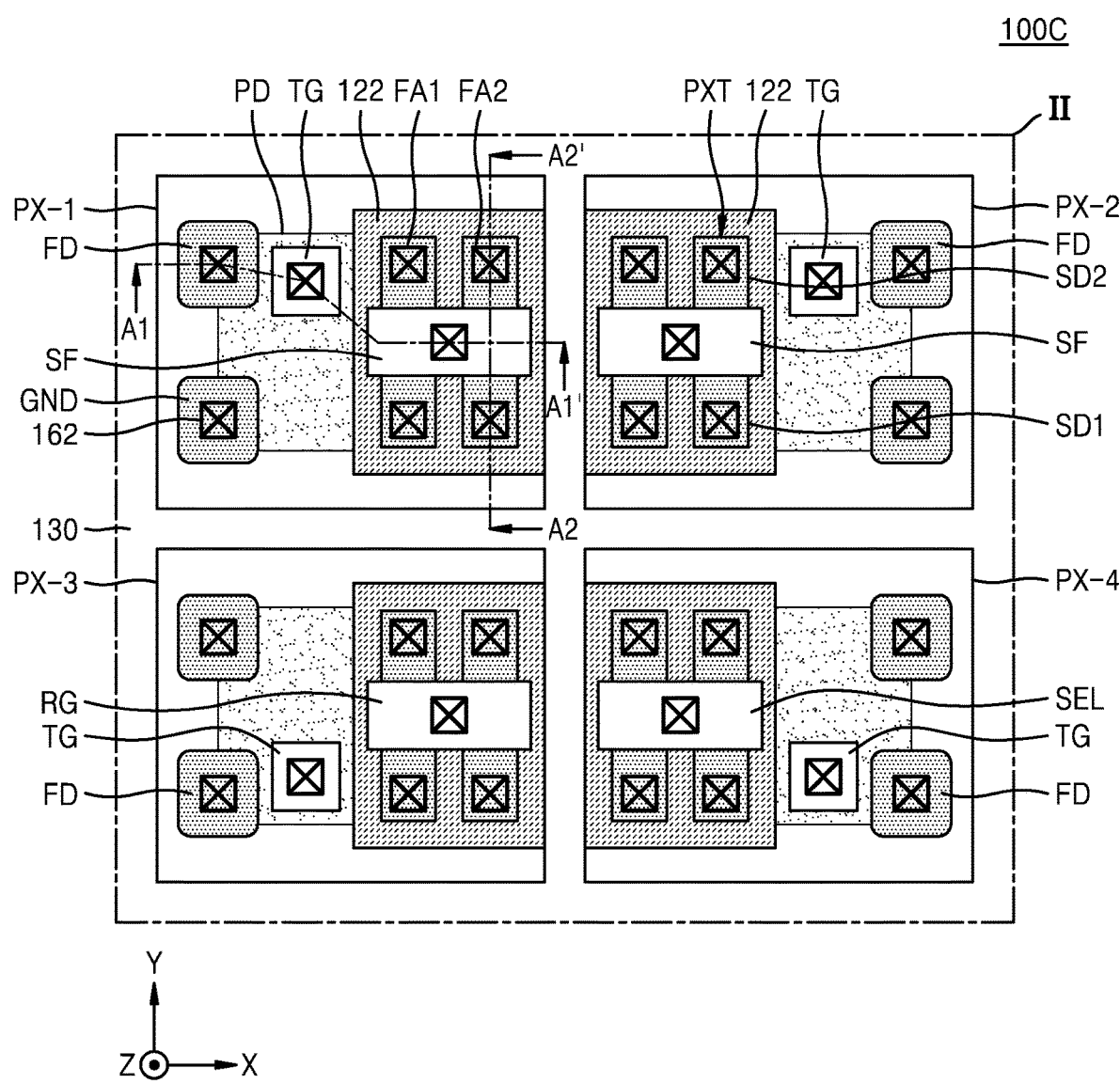
FIG. 10 is a layout diagram showing an image sensor according to example embodiments.
Figure 11:
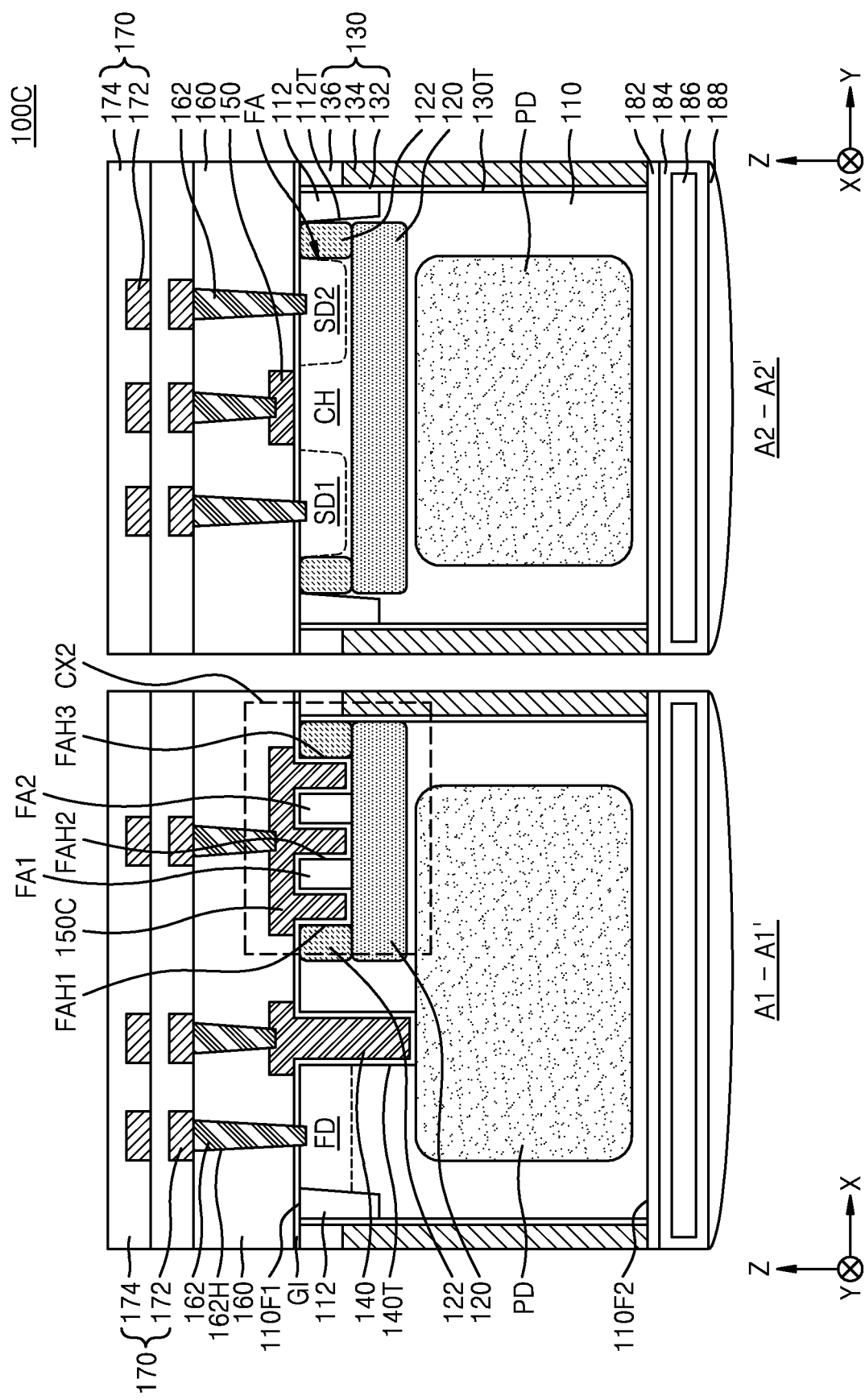
FIG. 11 is a cross-sectional view taken along lines A1-A1' and A2-A2' of FIG. 10.
Figure 12:
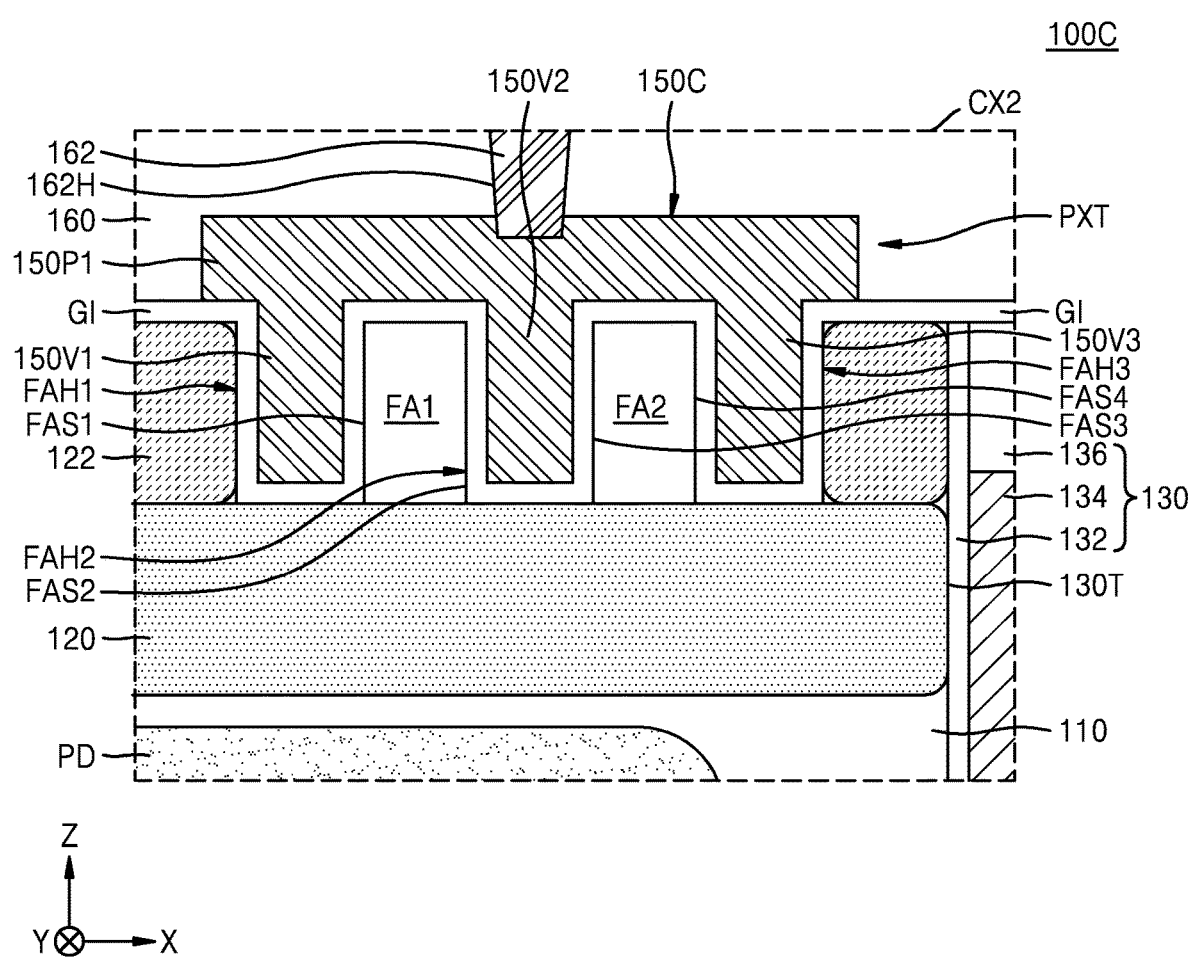
FIG. 12 is an enlarged view of portion CX2 of FIG. 11.

FIG. 10 is a layout diagram showing an image sensor 100C according to example embodiments. FIG. 11 is a cross-sectional view taken along lines A1-A1' and A2-A2' of FIG. 10. FIG. 12 is an enlarged view of portion CX2 of FIG. 11.

Referring to FIGS. 10 to 12, the pixel transistor PXT may be a finFET transistor having a dual-fin structure. The pixel transistor PXT may include a first gate electrode 150C disposed in a first fin-type active region FA1 and a second fin-type active region FA2.

The first fin-type active region FA1 may be defined by the first trench FAH1 and the second trench FAH2 extending from the first surface 110F1 of the semiconductor substrate 110 into the semiconductor substrate 110, and the second fin-type active region FA2 may be defined by the second trench FAH2 and a third trench FAH3 extending from the first surface 110F1 of the semiconductor substrate 110 into the semiconductor substrate 110.

The first gate electrode 150C may include the horizontal extension 150P1, the first vertical extension 150V1, the second vertical extension 150V2, and a third vertical extension 150V3. The first vertical extension 150V1 may be disposed inside the first trench FAH1 to cover the first sidewall FAS1 of the first fin-type active region FA1, and the second vertical extension 150V2 may be disposed inside the second trench FAH2 to cover the second sidewall FAS2 of the first fin-type active region FA1 and a first sidewall FAS3 of the second fin-type active region FA2. The third vertical extension 150V3 may be disposed inside the third trench FAH3 and cover a second sidewall FAS4 of the second fin-type active region FA2. The horizontal extension 150P1 may cover the top surface of the first fin-type active region FA1 and the top surface of the second fin-type active region FA2, and may be connected to first to third vertical extensions 150V1, 150V2, and 150V3.

According to example embodiments, because the pixel transistor PXT has a dual-fin structure, a relatively large effective gate width may be secured even when the size of the pixel transistor PXT is small, and the control ability of a gate for a channel may be improved. Therefore, read noise may be reduced and a leakage current of the pixel transistor PXT may be reduced. Also, because the pixel transistor PXT may be configured as a junctionless transistor in which the channel region CH, the first source/drain region SD1, and the second source/drain region SD2 in the fin-type active region FA have the same conductivity type, generation of a junction leakage current may be prevented. Therefore, the image sensor 100C may have improved image quality.

Figure 13:
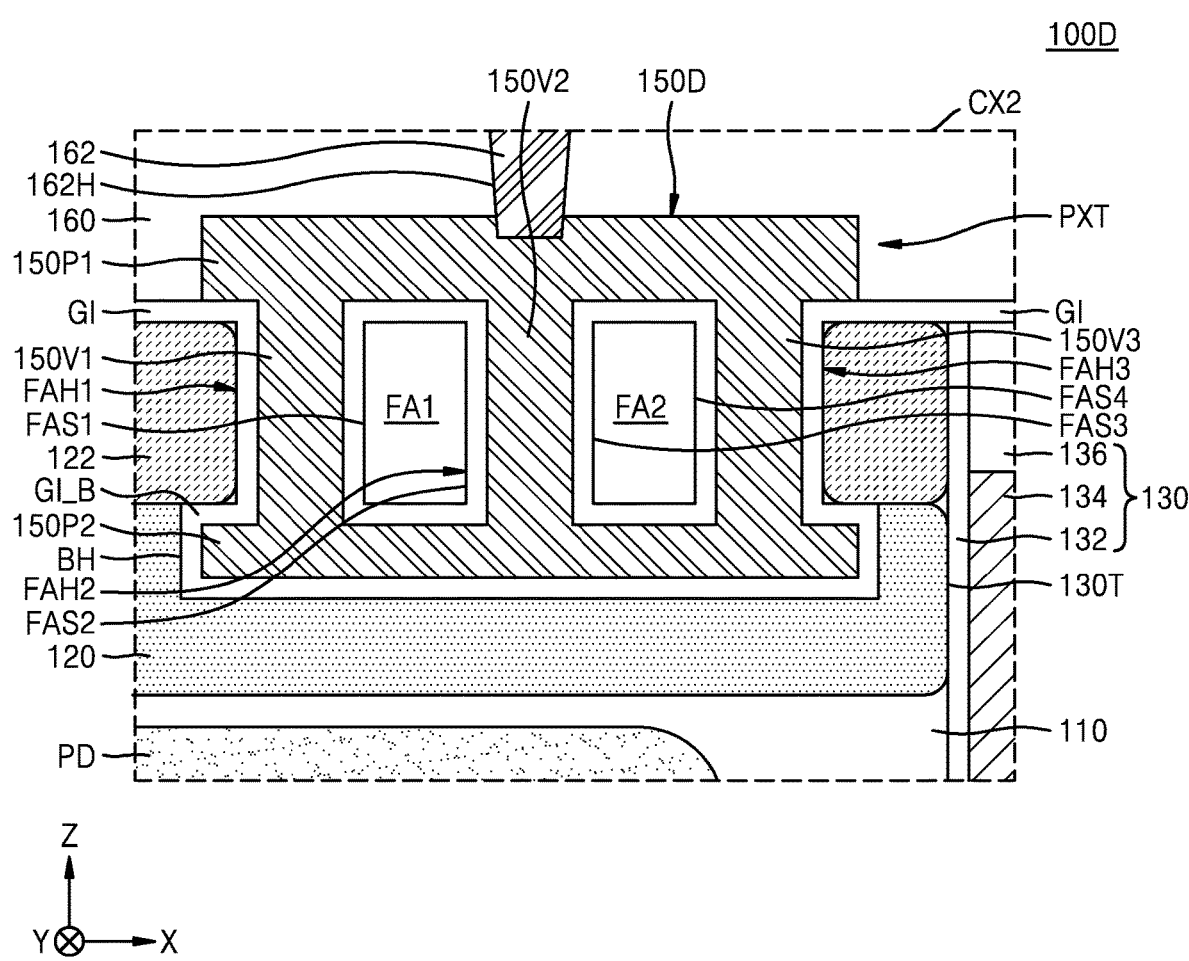
FIG. 13 is a cross-sectional view of an image sensor according to example embodiments.

FIG. 13 is a cross-sectional view of an image sensor 100D according to example embodiments. FIG. 13 is an enlarged view of portion corresponding to CX2 in FIG. 11.

Referring to FIG. 13, the pixel transistor PXT may be a gate-all-around transistor having multiple channels.

The pixel transistor PXT may include a first gate electrode 150D disposed to surround the first fin-type active region FA1 and the second fin-type active region FA2.

The first gate electrode 150D may include the first horizontal extension 150P1, the second horizontal extension 150P2, the first vertical extension 150V1, the second vertical extension 150V2, and the third vertical extension 150V3. The first vertical extension 150V1 may be disposed inside the first trench FAH1 to cover the first sidewall FAS1 of the first fin-type active region FA1, and the second vertical extension 150V2 may be disposed inside the second trench FAH2 to cover the second sidewall FAS2 of the first fin-type active region FA1 and the first sidewall FAS3 of the second fin-type active region FA2. The third vertical extension 150V3 may be disposed inside the third trench FAH3 and cover the second sidewall FAS4 of the second fin-type active region FA2. The first horizontal extension 150P1 may cover the top surface of the first fin-type active region FA1 and the top surface of the second fin-type active region FA2, and may be connected to the first to third vertical extensions 150V1, 150V2, and 150V3.

The bottom hole BH may connect with the bottoms of first to third trenches FAH1, FAH2, and FAH3 and extend in a horizontal direction. The second horizontal extension 150P2 may be disposed inside the bottom hole BH. The second horizontal extension 150P2 may cover the bottom surface of the first fin-type active region FA1 and the bottom surface of the second fin-type active region FA2, and may be connected to the first to third vertical extensions 150V1, 150V2, and 150V3.

According to example embodiments, because the pixel transistor PXT has a gate-all-around structure having multiple channels, a relatively large effective gate width may be secured even when the size of the pixel transistor PXT is small, and the control ability of a gate for a channel may be improved. Therefore, read noise may be reduced and a leakage current of the pixel transistor PXT may be reduced. Also, because the pixel transistor PXT may be configured as a junctionless transistor in which the channel region CH, the first source/drain region SD1, and the second source/drain region SD2 in the fin-type active region FA have the same conductivity type, generation of a junction leakage current may be prevented. Therefore, the image sensor 100D may have improved image quality.

Figure 14:
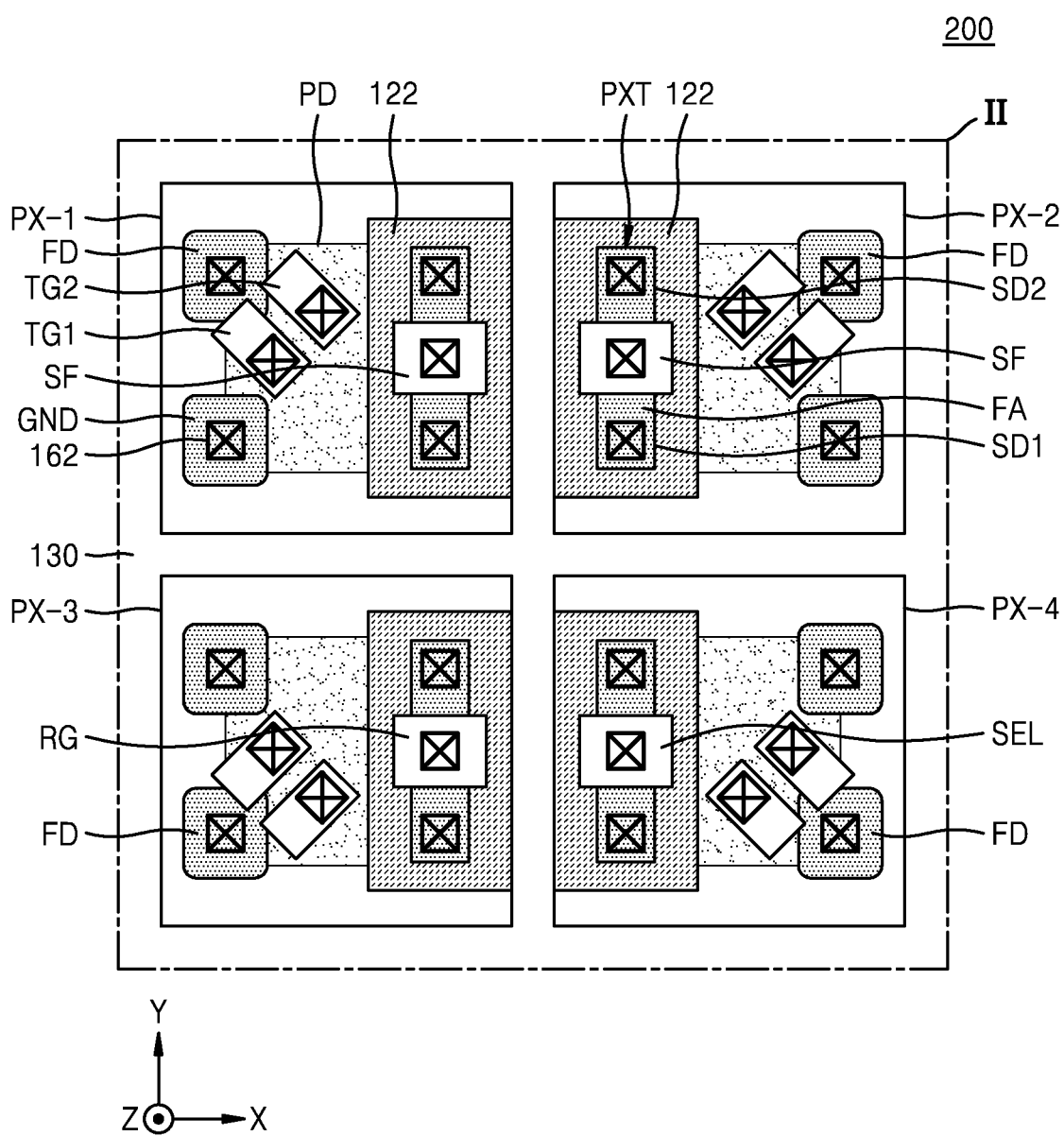
FIG. 14 is a layout diagram showing an image sensor according to example embodiments.

FIG. 14 is a layout diagram showing an image sensor 200 according to example embodiments.

Referring to FIG. 14, the pixel transistor PXT may include transmission gates having a dual gate structure, that is, a first transmission gate TG1 and a second transmission gate TG2. A pair of buried transmission gate electrodes 140 (refer to FIG. 3) may be formed, and the pair of buried transmission gate electrodes 140 spaced apart from each other may be referred to as a first transmission gate TG1 and a second transmission gate TG2, respectively. The first transmission gate TG1 and the second transmission gate TG2 may be spaced apart from each other by a certain distance and arranged adjacent to the floating diffusion region FD.

Figure 15:
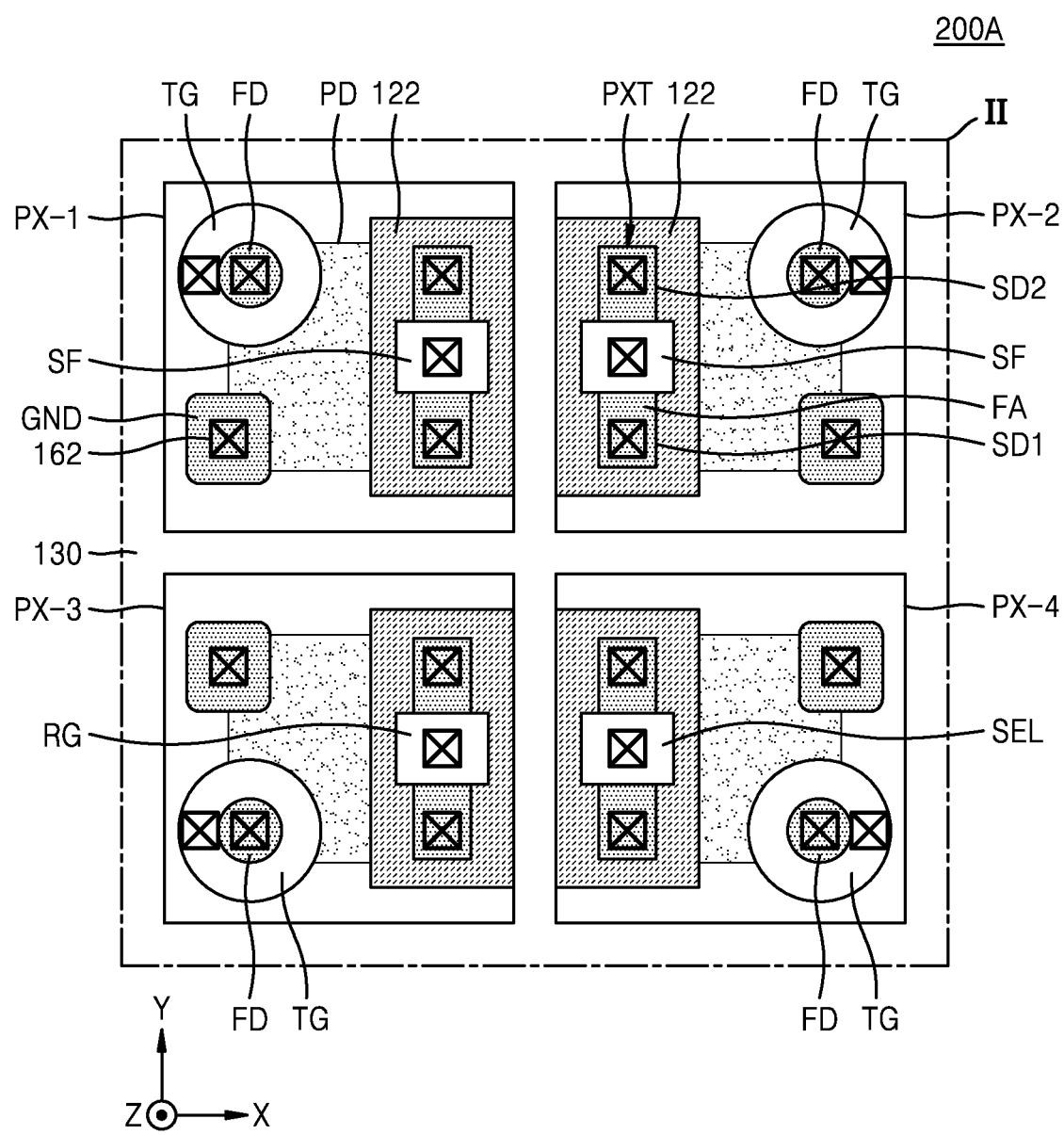
FIG. 15 is a layout diagram showing an image sensor according to example embodiments.

FIG. 15 is a layout diagram showing an image sensor 200A according to example embodiments.

Referring to FIG. 15, the image sensor 200A may include the transmission gate TG having a ring-shaped gate structure. The transmission gate TG is disposed to surround the floating diffusion region FD and may have a ring-like shape or an annular shape when viewed from above.

According to example embodiments, as the transmission gate TG is disposed to surround the floating diffusion region FD, a charge transmission path may be formed in a direction perpendicular to the first surface 110F1 of the semiconductor substrate 110. Therefore, the sensitivity in low-illuminance, which may easily deteriorate according to the shape of the transmission gate TG, may be improved, and thus, the image sensor 200A may have excellent quality.

Figure 16:
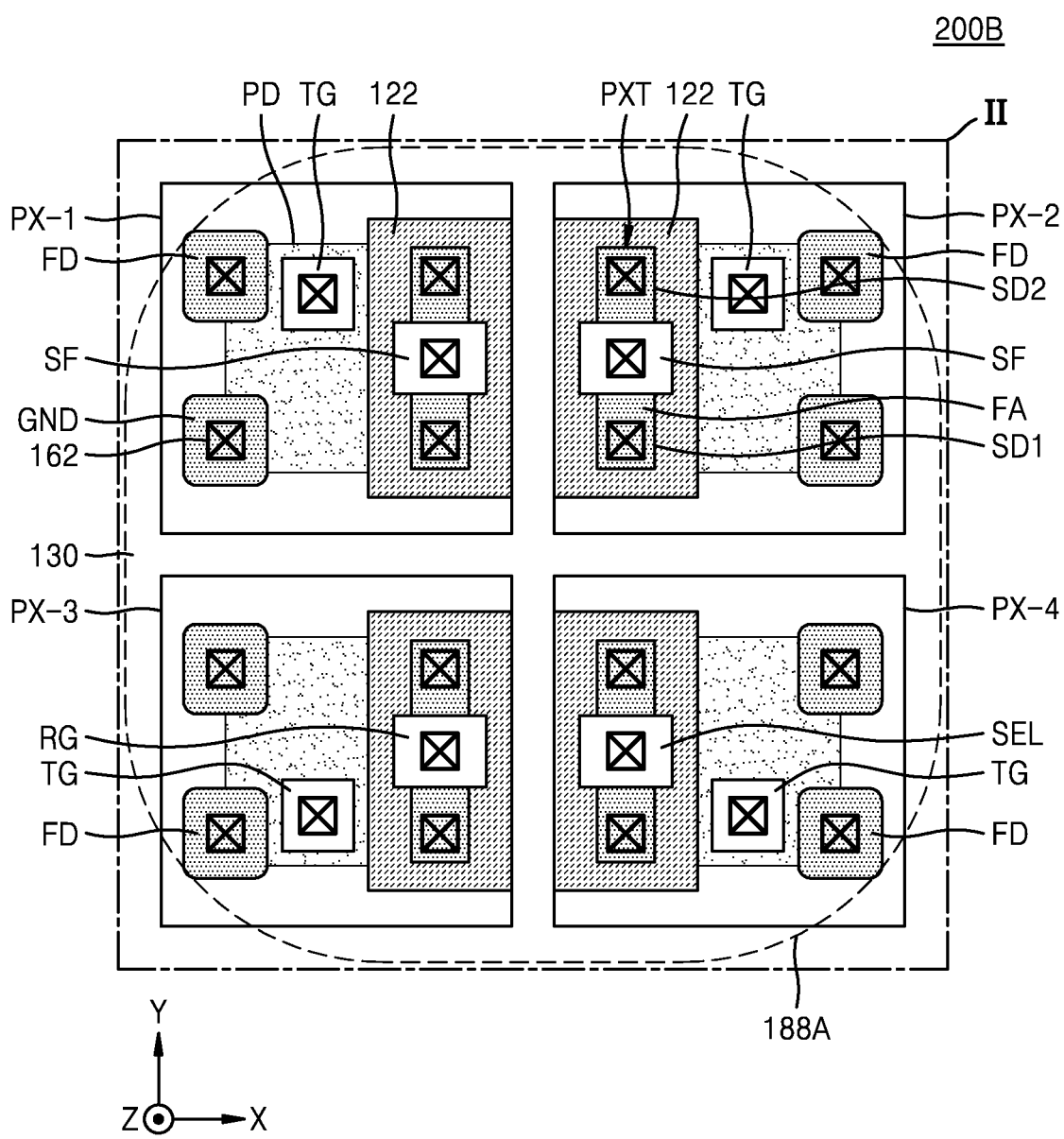
FIG. 16 is a layout diagram showing an image sensor according to example embodiments.

FIG. 16 is a layout diagram showing an image sensor 200B according to example embodiments.

Referring to FIG. 16, the image sensor 200B may include first to fourth pixels PX-1, PX-2, PX-3, and PX-4, which may be used to implement an auto-focus (AF) function. For example, the first to fourth pixels PX-1, PX-2, PX-3, and PX-4 may be covered by one micro lens 188A.

The first to fourth pixels PX-1, PX-2, PX-3, and PX-4 may be phase detection pixels and may generate phase signals used to calculate phase differences between images. Phase signals may include information regarding positions of images formed on an image sensor 300, and the phase signals may be used to calculate phase differences between images. Based on calculated phase differences, a focal position of a lens of an electronic device including the image sensor 200B may be calculated. By controlling the lens based on the focal position, the object may be focused using the first to fourth pixels PX-1, PX-2, PX-3, and PX-4.

Figure 17:
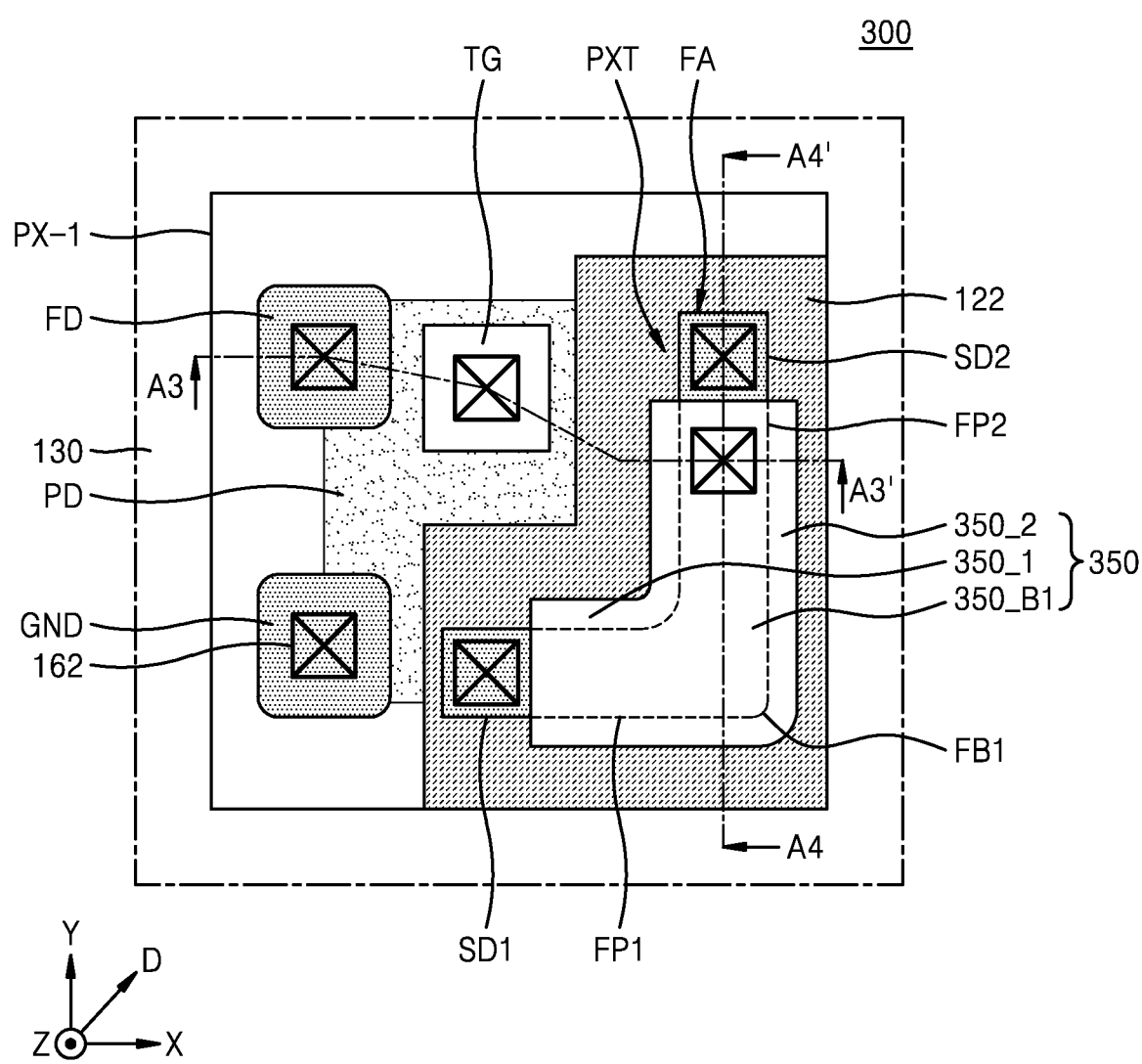
FIG. 17 is a layout diagram showing an image sensor according to example embodiments.
Figure 18:
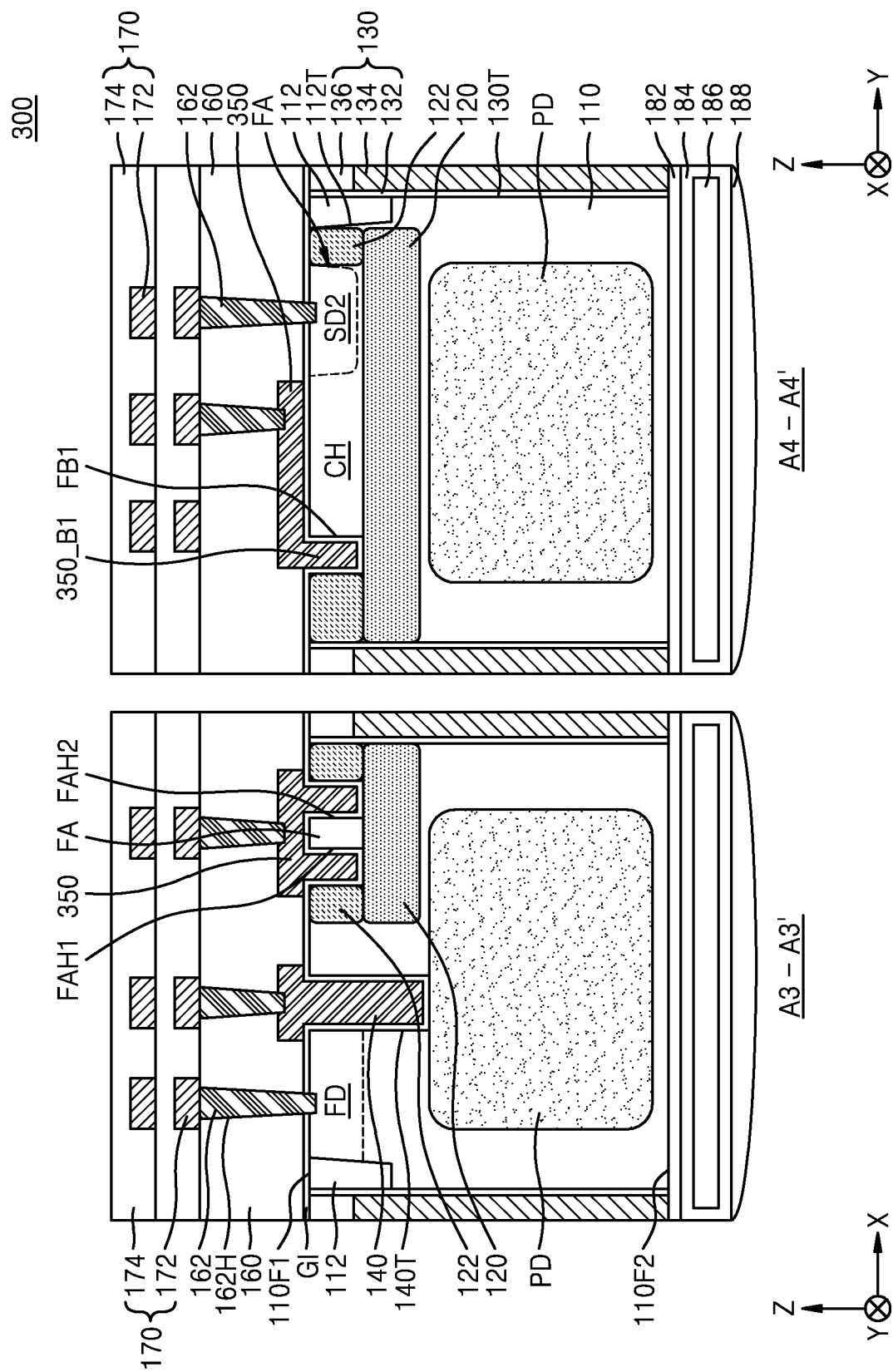
FIG. 18 is a cross-sectional view taken along lines A3-A3' and A4-A4' of FIG. 17.

FIG. 17 is a layout diagram showing an image sensor 300 according to example embodiments, and FIG. 18 is a cross-sectional view obtained along lines A3-A3' and A4-A4' of FIG. 17.

Referring to FIGS. 17 and 18, the fin-type active region FA may include a first portion FP1, a second portion FP2, and a bent portion FB1. For example, the first portion FP1 may extend in a first direction, the second portion FP2 may extend in a second direction different from the first direction, and the bent portion FB1 may refer to a portion of the fin-type active region FA disposed between the first portion FP1 and the second portion FP2. For example, the first portion FP1 and the second portion FP2 may be arranged to extend substantially perpendicular to each other (e.g., the extending direction of the second portion FP2 may be inclined at 90 degrees with respect to the extending direction of the first portion FP1), and the bent portion FB1 may be connected to the first portion FP1 and the second portion FP2. For example, when viewed from above, the fin-type active region FA may have an L-like shape. According to other example embodiments, the extending direction of the second portion FP2 may be inclined at an angle less than 90 degrees with respect to the extending direction of the first portion FP1.

According to example embodiments, top surfaces of the first portion FP1, the bent portion FB1, and the second portion FP2 of the fin-type active region FA may be arranged at the same vertical level, and top surfaces of the first portion FP1, the bent portion FB1, and the second portion FP2 may be arranged at the same vertical level as that of the first surface 110F1 of the semiconductor substrate 110. Both sidewalls of the fin-type active region FA may be defined by the first trench FAH1 and the second trench FAH2, and in this regard may each have an L-shaped horizontal cross-section.

A first gate electrode 350 may be disposed on the first portion FP1, the second portion FP2, and the bent portion FB1 of the fin-type active region FA, and may be disposed to cover both sidewalls of the fin-type active region FA. The first gate electrode 350 may include a first gate portion 350_1 extending in a first direction and covering both sidewalls of the first portion FP1 of the fin-type active region FA, a second gate portion 350_2 extending in a second direction different from the first direction and covering both sidewalls of the second portion FP2 of the fin-type active region FA, and a gate bent portion 350_B1 covering both sidewalls of the bent portion FB1 of the fin-type active region FA.

The fin-type active region FA may include a channel region CH, a first source/drain region SD1, and a second source/drain region SD2. For example, the channel region CH may be defined in the fin-type active region FA covered by the first gate electrode 350. For example, the channel region CH may be formed in the first portion FP1, the bent portion FB1, and the second portion FP2 of the fin-type active region FA. The first source/drain region SD1 may be defined in a portion of the fin-type active region FA disposed on one edge of the first gate electrode 350 (e.g., within the first portion FP1 of the fin-type active region FA), and the second source/drain region SD2 may be defined in a portion of the fin-type active region FA disposed on another edge of the first gate electrode 350 (e.g., the second portion FP2 of the fin-type active region FA).

According to example embodiments, the channel region CH may have a first conductivity type, and the first source/drain region SD1 and the second source/drain region SD2 may have the same first conductivity type as the channel region CH. In this case, the pixel transistor PXT, including the first gate electrode 350 and the fin-type active region FA, may constitute a junctionless transistor. According to other example embodiments, the channel region CH may have a first conductivity type, and the first source/drain region SD1 and the second source/drain region SD2 may have a first conductivity type different from that of the channel region CH. In this case, the pixel transistor PXT, including the first gate electrode 350 and the fin-type active region FA, may constitute a junction transistor.

According to example embodiments, as the fin-type active region FA has a shape including the bent portion FB1, an effective channel length of the fin-type active region FA or a surface area of the fin-type active region FA facing the first gate electrode 350 may be relatively large. Therefore, even when the size of the pixel transistor PXT is small, a relatively large effective gate width may be secured and the control ability of a gate for a channel may be improved, and thus, read noise may be reduced and a leakage current of the pixel transistor PXT may be reduced. Therefore, the image sensor 300 may have improved image quality.

Figure 19:
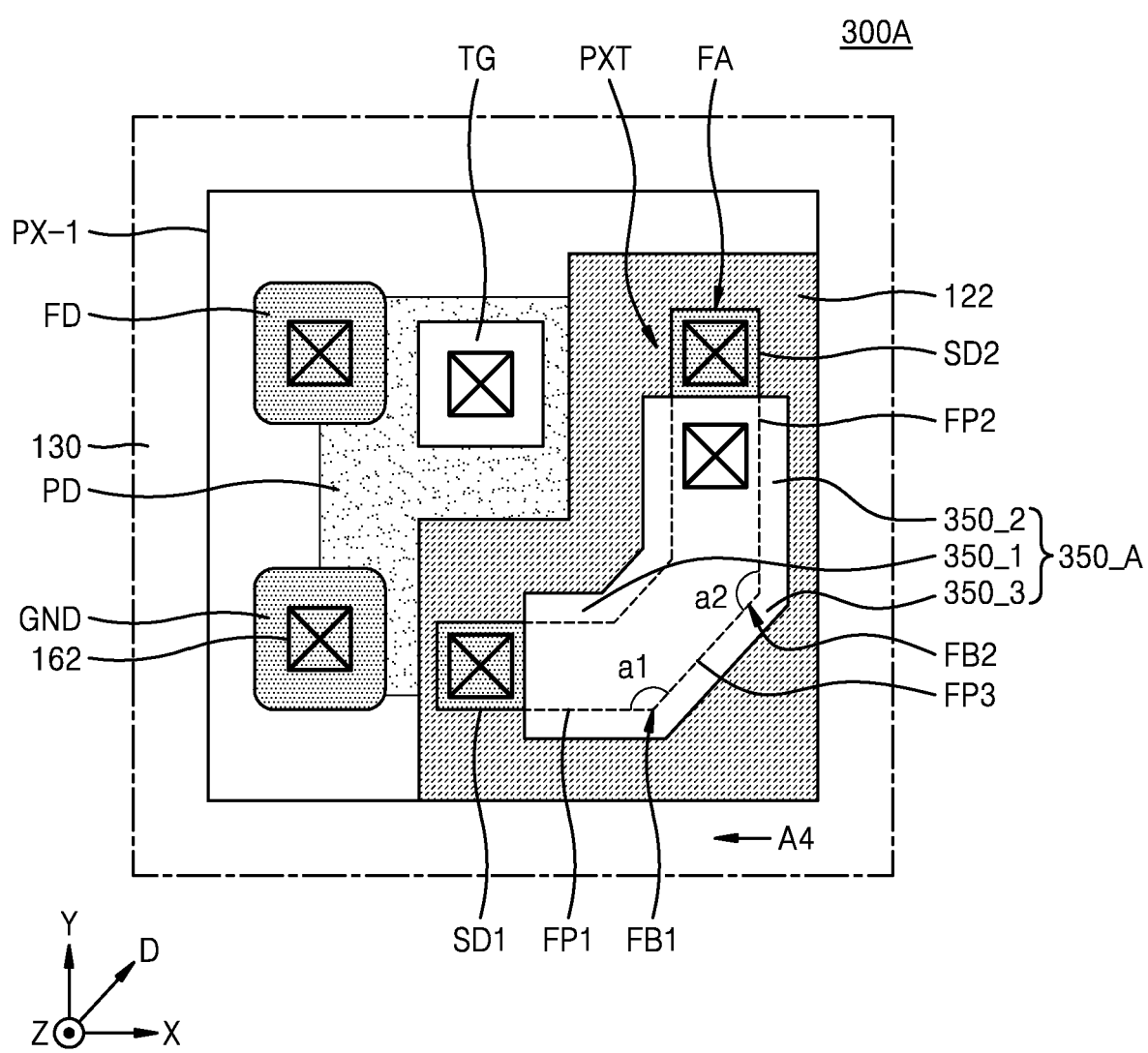
FIG. 19 is a layout diagram showing an image sensor according to example embodiments.

FIG. 19 is a layout diagram showing an image sensor 300A according to example embodiments.

Referring to FIG. 19, the fin-type active region FA may include the first portion FP1, the second portion FP2, and a third portion FP3. The first portion FP1 may extend in the first direction X, the second portion FP2 may extend in the second direction Y, and the third portion FP3 may be disposed between the first portion FP1 and the second portion FP2 and extend in a third direction D between the first direction X and the second direction Y. The third direction D may be a diagonal direction between the first direction X and the second direction Y. For example, the extending direction of the third portion FP3 may be inclined at a first inclination angle a1 greater than 90 degrees and less than 180 degrees with respect to the extending direction of the first portion FP1, and the extending direction of the third portion FP3 may be inclined at a second inclination angle a2 greater than 90 degrees and less than 180 degrees with respect to the extending direction of the second portion FP2. According to some example embodiments, the first inclination angle a1 and the second inclination angle a2 may each be from about 120 degrees to about 150 degrees.

According to example embodiments, as the fin-type active region FA is disposed to include the first portion FP1, the second portion FP2, and the third portion FP3, a first bent portion FB1 may be formed between the sidewalls of the first portion FP1 and sidewalls of the third portion FP3, and a second bent portion FB2 may be formed between the sidewalls of the second portion FP2 and the sidewalls of the third portion FP3.

A first gate electrode 350_A may be disposed on the first portion FP1, the second portion FP2, and the third portion FP3 of the fin-type active region FA, and may be disposed to cover both sidewalls of the fin-type active region FA. The first gate electrode 350_A may include the first gate portion 350_1 extending in the first direction X and covering both sidewalls of the first portion FP1 of the fin-type active region FA, the second gate portion 350_2 extending in the second direction Y different from the first direction X and covering both sidewalls of the second portion FP2 of the fin-type active region FA, and a third gate portion 350_3 covering both sidewalls of the third portion FP3 of the fin-type active region FA and extending in the third direction D.

According to example embodiments, the fin-type active region FA may include the first portion FP1, the second portion FP2, and the third portion FP3 extending in different directions, and the first bent portion FB1 and the second bent portion FB2 may be formed therebetween relatively gently without a sharp inclination. Therefore, when the pixel transistor PXT is turned on, it is possible to prevent an electric field from being concentrated in a portion of the fin-type active region FA (e.g., in the first bent portion FB1 or the second bent portion FB2), and the reliability of the image sensor 300A including the pixel transistor PXT may be improved.

Figure 20:
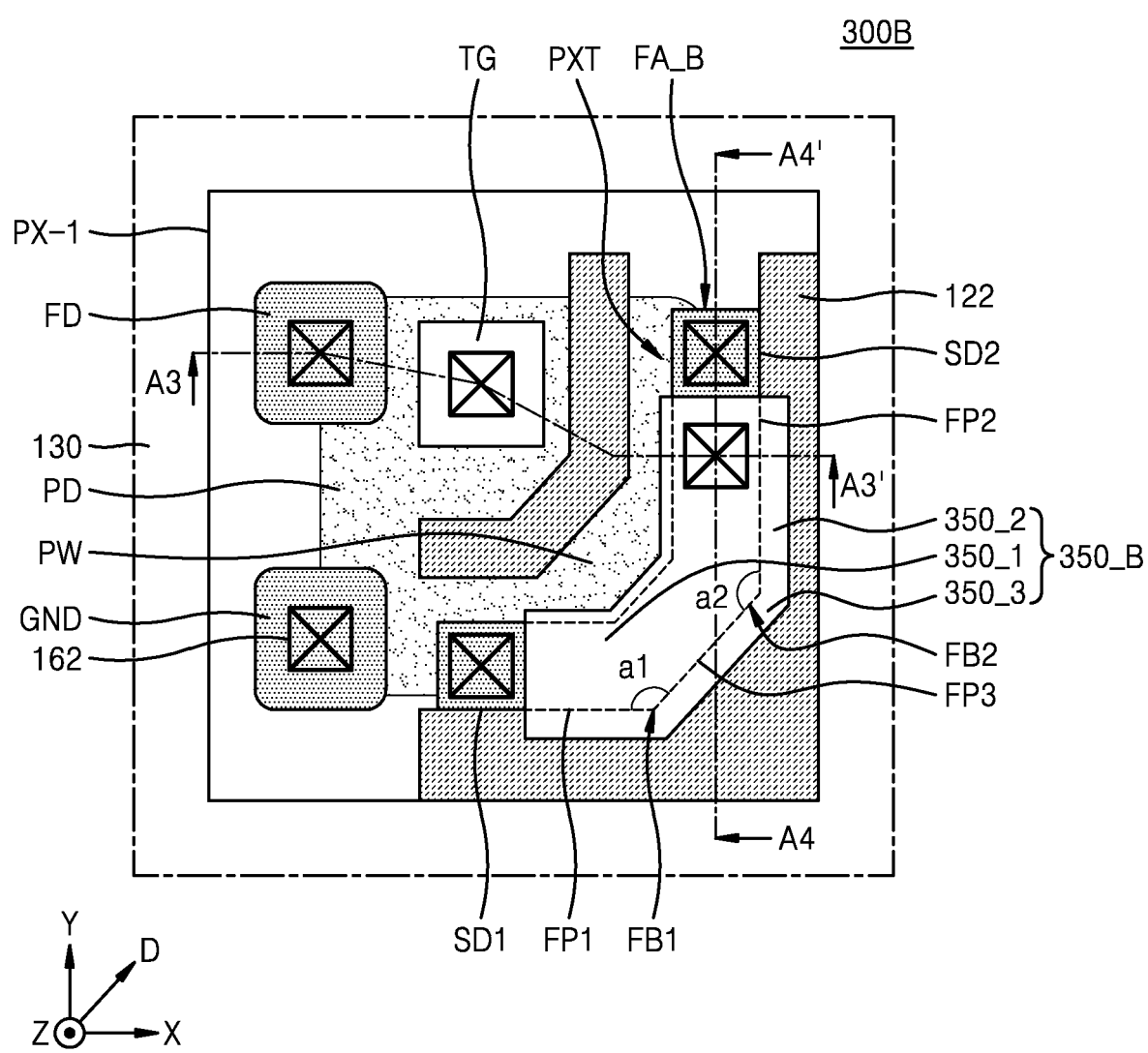
FIG. 20 is a layout diagram showing an image sensor according to example embodiments.
Figure 21:
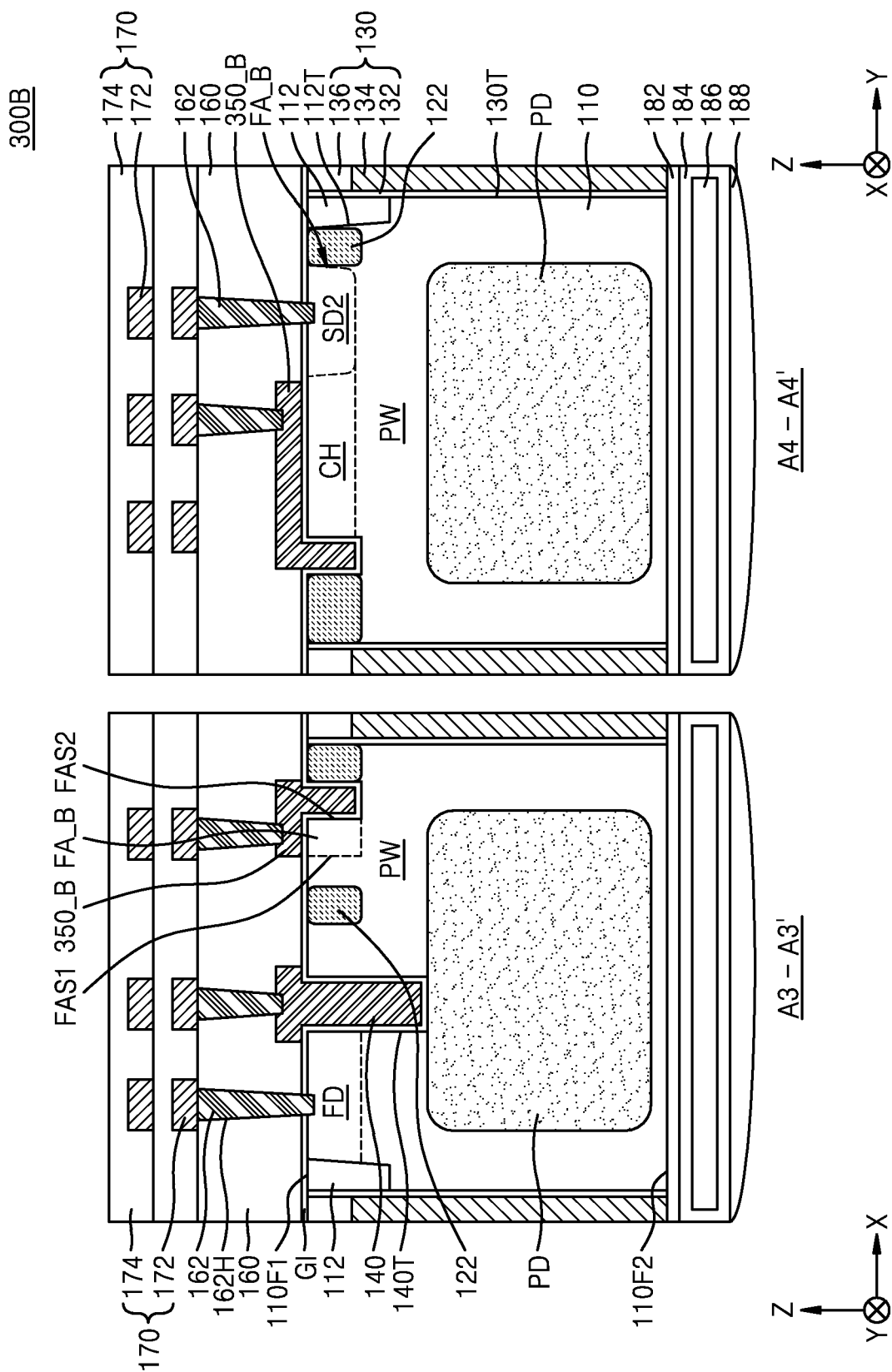
FIG. 21 is a cross-sectional view taken along lines A3-A3' and A4-A4' of FIG. 20.

FIG. 20 is a layout diagram showing an image sensor 300B according to example embodiments, and FIG. 21 is a cross-sectional view obtained along lines A3-A3' and A4-A4' of FIG. 20.

Referring to FIGS. 20 and 21, the first sidewall FAS1 of a fin-type active region FAB may contact a p-well region PW. The p-well region PW may extend into the semiconductor substrate 110 from the same vertical level as the top surface of the fin-type active region FA_B (e.g., from the same vertical level as the first surface 110F1 of the semiconductor substrate 110) and may be disposed between the fin-type active region FA_B and the photoelectric conversion region PD.

The second sidewall FAS2 of the fin-type active region FA_B may be defined by a trench and may be covered by a first gate electrode 350_B disposed in the second trench FAH2. As shown in FIG. 21, the first gate electrode 350_B is disposed on the second sidewall FAS2 and the top surface of the fin-type active region FA_B, and the first sidewall FAS1 of the fin-type active region FA_B may not contact the first gate electrode 350_B.

Although FIG. 21 shows an example in which the lower barrier region 120 (refer to FIG. 18) is omitted, according to other example embodiments, the lower barrier region 120 may be further formed between the p-well region PW and the photoelectric conversion region PD.

Figure 22:
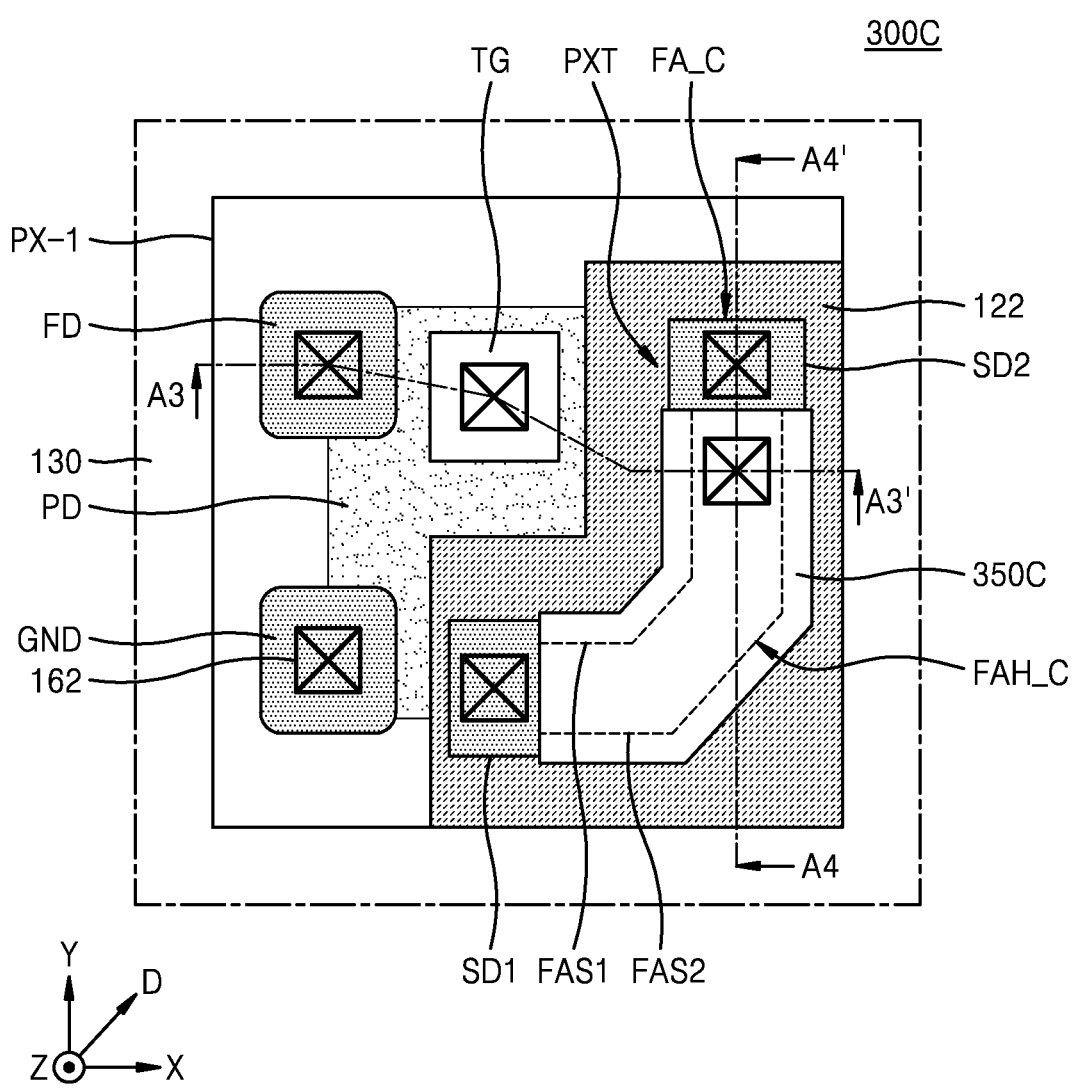
FIG. 22 is a layout diagram showing an image sensor according to example embodiments.
Figure 23:
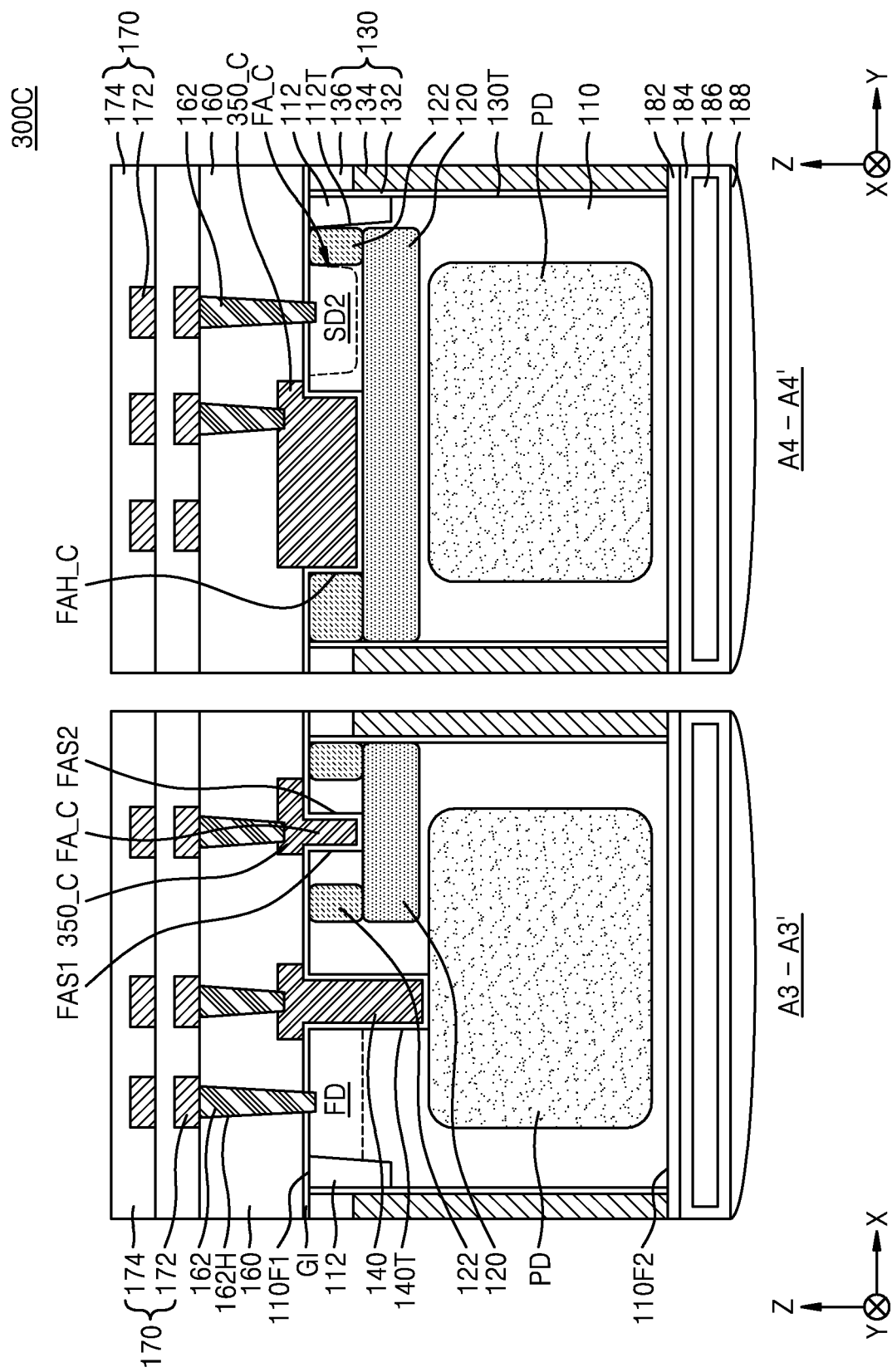
FIG. 23 is a cross-sectional view taken along lines A3-A3' and A4-A4' of FIG. 22.

FIG. 22 is a layout diagram showing an image sensor 300C according to example embodiments, and FIG. 23 is a cross-sectional view obtained along lines A3-A3' and A4-A4' of FIG. 22.

Referring to FIGS. 22 and 23, a fin-type active region FA_C may have a reverse-type fin structure in which both sidewalls are defined by a single trench FAH_C. For example, the single trench FAH_C may extend from the first surface 110F1 of the semiconductor substrate 110 into the semiconductor substrate 110, and the first sidewall FAS1 and the second sidewall FAS2 of the fin-type active region FA_C may refer to surfaces of the semiconductor substrate 110 exposed by the single trench FAH_C, respectively. A first gate electrode 350C may be disposed inside the single trench FAH_C and may cover the first sidewall FAS1 and the second sidewall FAS2 of the fin-type active region FA_C.

As the fin-type active region FA_C has a reverse-type fin structure, a vertical channel may be formed in the inner region of the semiconductor substrate 110 along the first sidewall FAS1 and the second sidewall FAS2 of the fin-type active region FA_C exposed in the single trench FAH_C.

Figure 24:
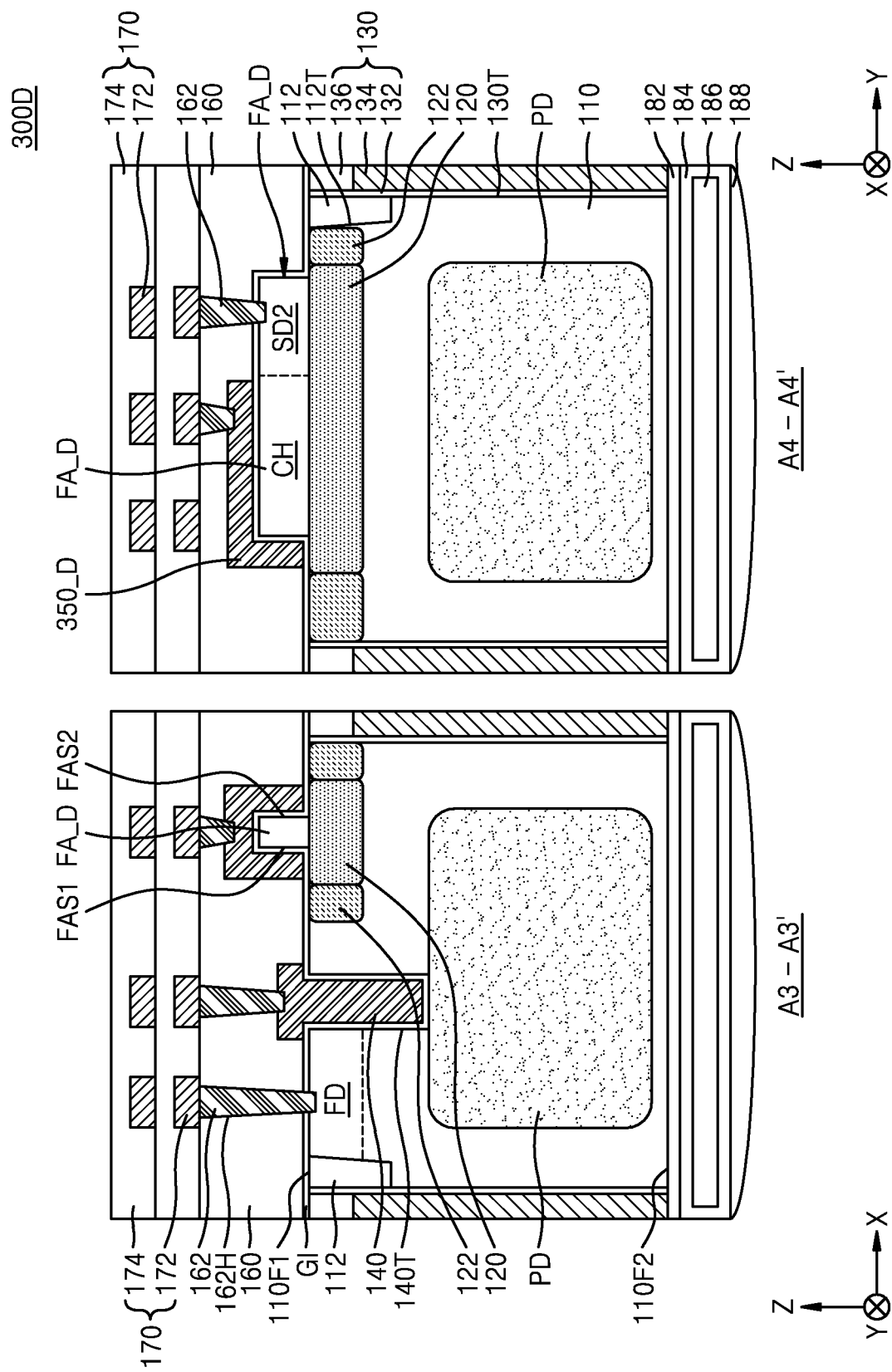
FIG. 24 is a cross-sectional view of an image sensor according to example embodiments.

FIG. 24 is a cross-sectional view of an image sensor 300D according to example embodiments.

Referring to FIG. 24, a fin-type active region FA_D may be disposed to protrude from the first surface 110F1 of the semiconductor substrate 110 in the vertical direction Z, and both the first sidewall FAS1 and the second sidewall FAS2 of the fin-type active region FA_D may be arranged at a vertical level higher than that of the first surface 110F1 of the semiconductor substrate 110. According to example embodiments, the fin-type active region FA_D may be formed on the first surface 110F1 of the semiconductor substrate 110 through an epitaxial growth process, etc.

A first gate electrode 350_D may be disposed to cover both the first sidewall FAS1 and the second sidewall FAS2 of the fin-type active region FA_D and may be placed at a high vertical level than that of the first surface 110F1 of the semiconductor substrate 110.

According to some example embodiments, any one of image sensors 300, 300A, 300B, 300C, and 300D described above with reference to FIGS. 17 to 24 may be formed in combination of any of the technical features of an image sensor described above with respect to FIGS. 6 to 16. For example, as described above with respect to FIGS. 6 and 7, the lower insulation layer 124 may be formed below the fin-type active region FA including the bent portion FB1 described with reference to FIG. 17 or, as described above with respect to FIGS. 8 and 9, the gate-all-around type first gate electrode 150 may be formed around the fin-type active region FA including the bent portion FB1 described above with respect to FIG. 17. For example, the pixel transistor PXT including the fin-type active region FA including the bent portion FB1 described with reference to FIG. 17 may be disposed together with first and second transmission gates TG1 and TG2 having a dual-gate transmission structure as described above with respect to FIG. 14.

FIG. 25 is a schematic view of an image sensor 400 according to example embodiments.

Referring to FIG. 25, the image sensor 400 may be a stacked image sensor including a first chip C1 and a second chip C2 stacked in a vertical direction. The first chip C1 may include the active pixel region APR and a first pad region PDR1, and the second chip C2 may include the peripheral circuit region PCR and a second pad region PDR2.

A plurality of first pads PAD1 in the first pad region PDR1 may be configured to transmit and receive electrical signals to and from an external device. The peripheral circuit region PCR may include a logic circuit block LC and may include a plurality of CMOS transistors. The peripheral circuit region PCR may provide a certain signal to each active pixel PX of the active pixel region APR or control an output signal from each active pixel PX. The first pads PAD1 in the first pad region PDR1 may be electrically connected to second pads PAD2 in the second pad region PDR2 by a via structure VS.

Figure 26:
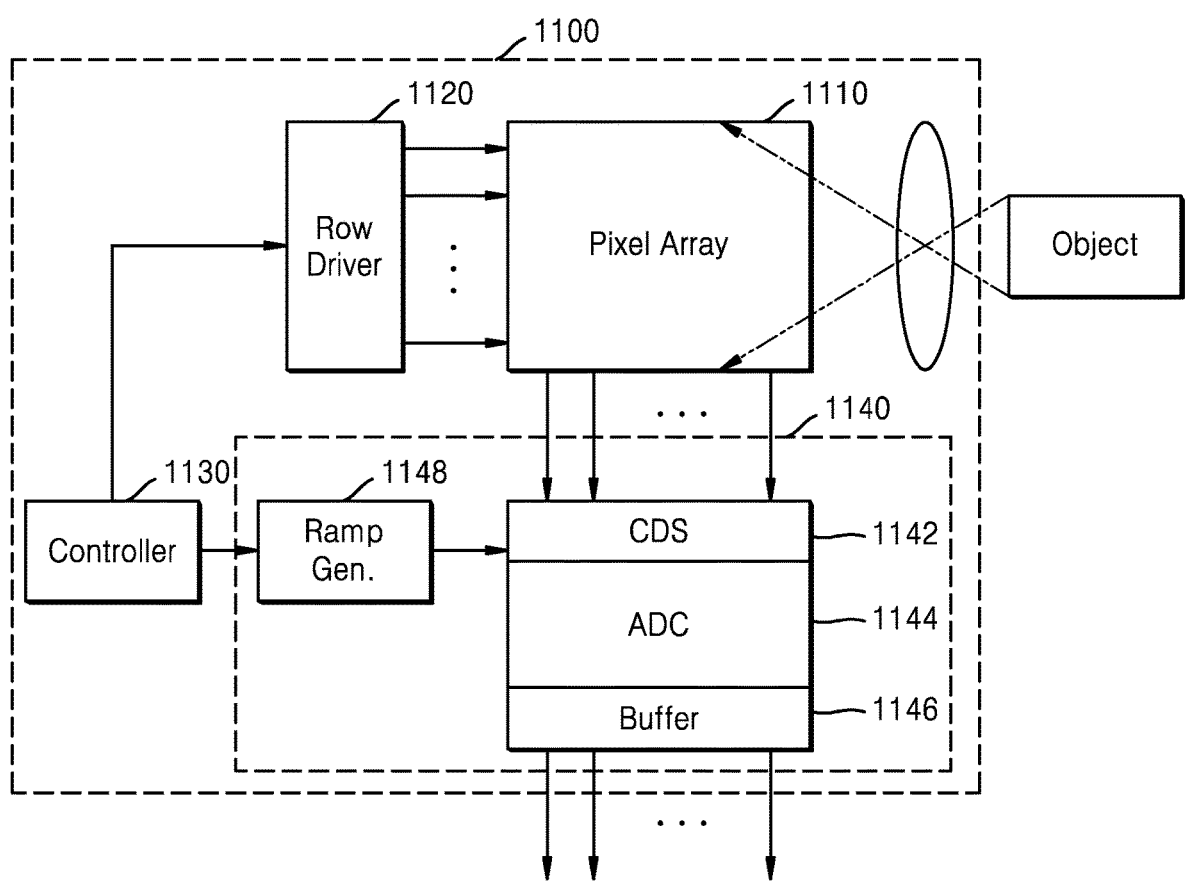
FIG. 26 is a block diagram showing the configuration of an image sensor according to an example embodiment.

FIG. 26 is a block diagram showing the configuration of an image sensor 1100 according to an example embodiment.

Referring to FIG. 26, the image sensor 1100 may include a pixel array 1110, a controller 1130, a row driver 1120, and a pixel signal processor 1140. The image sensor 1100 includes at least one of image sensors 100, 100A, 100B, 100C, 100D, 200, 200A, 200B, 300, 300A, 300B, 300C, 300D, and 400 described above with reference to FIGS. 1 to 25.

The pixel array 1110 may include a plurality of unit pixels that are 2-dimensionally arranged, and each unit pixel may include a photoelectric conversion element. The photoelectric conversion element may absorb light to generate charges and an electric signal (output voltage) based on generated charges may be provided to the pixel signal processor 1140 through a vertical signal line. Unit pixels included in the pixel array 1110 may provide one output voltage at a time row-by-row, and thus unit pixels belonging to one row of the pixel array 1110 may be simultaneously activated by a selection signal output by the row driver 1120. Unit pixels belonging to a selected row may provide an output voltage according to absorbed light to an output line of a corresponding column.

The controller 1130 may control the row driver 1120, such that the pixel array 1110 absorbs light and accumulates charges or temporarily stores accumulated charges and outputs electric signals according to stored charges to the outside of the pixel array 1110. Also, the controller 1130 may control the pixel signal processor 1140 to measure an output voltage provided by the pixel array 1110.

The pixel signal processor 1140 may include a correlation double sampler (CDS) 1142, an analog-digital converter (ADC) 1144, and a buffer 1146. The CDS 1142 may sample and hold an output voltage provided by the pixel array 1110. The CDS 1142 may double sample a particular noise level and a level according to a generated output voltage and output a level corresponding to a difference therebetween. Also, the CDS 1142 may receive ramp signals generated by a ramp signal generator 1148, compare them with each other, and output a result of the comparison.

The ADC 1144 may convert an analog signal corresponding to a level received from the CDS 1142 into a digital signal. The buffer 1146 may latch digital signals, and latched signals may be sequentially output to the outside of the image sensor 1100 and transmitted to an image processor.

While aspects of example embodiments have been particularly shown and described, it will be understood that various changes in form and details may be made therein without departing from the spirit and scope of the following claims.

What is claimed is:

1. An image sensor comprising:
   a semiconductor substrate comprising a first surface, a second surface opposite to the first surface, and a photoelectric conversion region provided between the first surface and the second surface;
   a buried transmission gate electrode provided in a transmission gate trench which extends into the semiconductor substrate from the first surface of the semiconductor substrate;
   a fin-type active region provided between a first trench and a second trench which extend from the first surface of the semiconductor substrate into the semiconductor substrate, wherein the fin-type active region comprises a first source/drain region, a second source/drain region, and a channel region provided between the first source/drain region and the second source/drain region; and
   a first gate electrode covering a top surface and both sidewalls of the fin-type active region, and inner walls of the first trench and the second trench,
   wherein the channel region, the first source/drain region and the second source/drain region each have a first conductivity type, and
   wherein the photoelectric conversion region and the fin-type active region overlap along a direction perpendicular to the first surface of the semiconductor substrate.

2. The image sensor of claim 1, wherein the first gate electrode comprises:
   a first vertical portion provided in the first trench and on a first sidewall of the fin-type active region;
   a second vertical portion provided in the second trench and on a second sidewall of the fin-type active region; and
   a horizontal portion provided on the top surface of the fin-type active region and integrally connected to the first vertical portion and the second vertical portion.

3. The image sensor of claim 1, wherein the first conductivity type is an n-type conductivity type, and
   wherein the photoelectric conversion region comprises an n-type impurity.

4. The image sensor of claim 3, further comprising:
   a lower barrier region provided between a bottom of the fin-type active region and the photoelectric conversion region; and
   a lateral barrier region surrounding the fin-type active region,
   wherein the lower barrier region comprises a p-type impurity, and the lateral barrier region comprises a p-type impurity or an insulation layer.

5. The image sensor of claim 4, further comprising a pixel device isolation layer provided in a pixel trench of the semiconductor substrate and defining a plurality of pixels in the semiconductor substrate,
   wherein the lateral barrier region and the lower barrier region are in contact with the pixel device isolation layer.

6. The image sensor of claim 1, further comprising:
   a gate insulation layer provided between the first gate electrode and the fin-type active region and conformally provided on an inner wall of the first trench and on an inner wall of the second trench;
   a lower barrier region provided between a bottom of the fin-type active region and the photoelectric conversion region; and
   a lower insulation layer provided in a bottom hole provided between a bottom of the first trench and the lower barrier region and between a bottom of the second trench and the lower barrier region.

7. The image sensor of claim 6, wherein the lower insulation layer protrudes outward with respect to sidewalls of the first trench and sidewalls of the second trench, and
   wherein the bottom of the first trench and the bottom of the second trench are in contact with the lower insulation layer.

8. The image sensor of claim 7, wherein a first portion of the gate insulation layer provided on the bottom of the first trench and a second portion of the gate insulation layer provided on the bottom of the second trench are connected to a top surface of the lower insulation layer.

9. The image sensor of claim 6, further comprising a lateral barrier region surrounding the fin-type active region, the first trench, and the second trench,
   wherein a bottom of the lateral barrier region is in contact with a top surface of the lower insulation layer.

10. The image sensor of claim 1, wherein a bottom surface of the fin-type active region is provided in bottom holes arranged at bottoms of the first trench and the second trench, and
    wherein the first gate electrode covers a top surface, the bottom surface, and both sidewalls of the fin-type active region and is provided on the inner walls of the first trench, the inner walls of the second trench, and inner walls of the bottom holes.

11. The image sensor of claim 1, wherein the fin-type active region comprises a first fin-type active region and a second fin-type active region spaced apart from each other, and wherein the first gate electrode covers both sidewalls and a top surface of the first fin-type active region and both sidewalls and a top surface of the second fin-type active region.

12. The image sensor of claim 11, further comprising a lower barrier region provided between a bottom of the first fin-type active region and the photoelectric conversion region, and between a bottom of the second fin-type active region and the photoelectric conversion region.

13. The image sensor of claim 1, wherein the fin-type active region comprises a first fin-type active region and a second fin-type active region spaced apart from each other,
wherein a bottom surface of the first fin-type active region and a bottom surface of the second fin-type active region are defined by bottom holes, and
wherein the first gate electrode covers both sidewalls, a top surface, and the bottom surface of the first fin-type active region and both sidewalls, a top surface, and the bottom surface of the second fin-type active region.

14. The image sensor of claim 1, wherein the buried transmission gate electrode comprises:
a first buried transmission gate electrode arranged in a first transmission gate trench; and
a second buried transmission gate electrode arranged in a second transmission gate trench that is spaced apart from the first transmission gate trench.

15. The image sensor of claim 1, wherein, when viewed in plan, the buried transmission gate electrode has a ring shape, and
wherein the buried transmission gate electrode at least partially surrounds a floating diffusion region provided in the semiconductor substrate.

16. An image sensor comprising:
a semiconductor substrate comprising a first surface, a second surface opposite to the first surface, and a photoelectric conversion region provided between the first surface and the second surface;
a buried transmission gate electrode provided in a transmission gate trench which extends into the semiconductor substrate from the first surface of the semiconductor substrate;
a fin-type active region provided between a first trench and a second trench which extend into the semiconductor substrate from the first surface of the semiconductor substrate, wherein the fin-type active region comprises a first portion which extends in a first direction parallel to the first surface of the semiconductor substrate, a second portion which extends in a second direction parallel to the first surface of the semiconductor substrate and different from the first direction, a bent portion connected between the first portion and the second portion, and an n-type impurity; and
a first gate electrode covering a top surface and both sidewalls of the fin-type active region.

17. The image sensor of claim 16, wherein the first gate electrode comprises:
a first gate portion covering the first portion of the fin-type active region;
a second gate portion covering the second portion of the fin-type active region; and
a gate bent portion covering the bent portion of the fin-type active region.

18. The image sensor of claim 16, wherein, when viewed in plan, the fin-type active region and the first gate electrode each have an L shape.

19. The image sensor of claim 16, wherein the fin-type active region further comprises a third portion provided between the first portion and the second portion, and
wherein the third portion extends in a third direction offset from each of the first direction and the second direction by more than 90 degrees and less than 180 degrees.

20. An image sensor comprising:
a semiconductor substrate comprising a first surface, a second surface opposite to the first surface, a plurality of pixels separated by pixel trenches formed in the semiconductor substrate, and photoelectric conversion regions provided in the plurality of pixels, respectively;
a buried transmission gate electrode provided in a transmission gate trench which extends into the semiconductor substrate from the first surface of the semiconductor substrate;
a floating diffusion region provided on one edge portion of the buried transmission gate electrode in the semiconductor substrate;
a fin-type active region provided between a first trench and a second trench which extend into the semiconductor substrate from the first surface of the semiconductor substrate, wherein the fin-type active region comprises a first portion which extends in a first direction parallel to the first surface of the semiconductor substrate, a second portion which extends in a second direction parallel to the first surface of the semiconductor substrate and different from the first direction, a bent portion connected between the first portion and the second portion, and an n-type impurity;
a first gate electrode provided in the first trench and the second trench, covering a top surface and both sidewalls of the fin-type active region, and comprising a first gate portion covering the first portion of the fin-type active region, a second gate portion covering the second portion of the fin-type active region, and a gate bent portion covering the bent portion of the fin-type active region; and
a lower barrier region provided between a bottom of the fin-type active region and the photoelectric conversion regions.

* * * * *